United States Patent
Akiyama et al.

(10) Patent No.: US 8,044,520 B2
(45) Date of Patent: Oct. 25, 2011

(54) SEMICONDUCTOR DEVICE

(75) Inventors: Noboru Akiyama, Hitachinaka (JP); Takayuki Hashimoto, Tokai (JP); Masaki Shiraishi, Hitachinaka (JP); Tetsuya Kawashima, Hitachi (JP); Koji Tateno, Takasaki (JP); Nobuyoshi Matsuura, Takasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 865 days.

(21) Appl. No.: 11/624,767

(22) Filed: Jan. 19, 2007

(65) Prior Publication Data

US 2007/0200537 A1    Aug. 30, 2007

(30) Foreign Application Priority Data

Feb. 24, 2006    (JP) .................................. 2006-048577

(51) Int. Cl.
    *H01L 23/52*      (2006.01)
    *H01L 29/40*      (2006.01)

(52) U.S. Cl. .................. 257/777; 257/337; 257/481

(58) Field of Classification Search ............ 257/337, 257/339, 341, 342, 476, 481, 678, 685, 686, 257/777

See application file for complete search history.

(56) References Cited

U.S. PATENT DOCUMENTS

| | | | | |
|---|---|---|---|---|
| 2003/0016505 A1* | 1/2003 | Jauregui | ........................ | 361/728 |
| 2004/0227547 A1* | 11/2004 | Shiraishi et al. | .............. | 327/110 |
| 2005/0156204 A1* | 7/2005 | Uno et al. | ...................... | 257/213 |
| 2005/0161785 A1* | 7/2005 | Kawashima et al. | ......... | 257/678 |
| 2005/0218489 A1* | 10/2005 | Satou et al. | .................... | 257/678 |
| 2005/0231990 A1* | 10/2005 | Uno et al. | ...................... | 363/147 |
| 2006/0132231 A1* | 6/2006 | Ishii et al. | ........................ | 330/10 |
| 2007/0131938 A1* | 6/2007 | Williams | ......................... | 257/77 |
| 2007/0278516 A1* | 12/2007 | Hashimoto et al. | ........... | 257/177 |
| 2008/0186004 A1* | 8/2008 | Williams | ....................... | 323/282 |

FOREIGN PATENT DOCUMENTS

| | | |
|---|---|---|
| JP | 2003-528449 | 9/2003 |
| JP | 2004-342735 | 12/2004 |
| JP | 2005-203584 | 7/2005 |
| JP | 2005-217072 | 8/2005 |
| JP | 2005-294464 | 10/2005 |
| JP | 2005-310907 | 11/2005 |
| WO | WO 01/72092 | 9/2001 |

\* cited by examiner

*Primary Examiner* — Zandra Smith
*Assistant Examiner* — Telly Green
(74) *Attorney, Agent, or Firm* — Antonelli, Terry, Stout & Kraus, LLP.

(57) ABSTRACT

A power supply capable of reducing loss of large current and high frequency. In an MCM for power supply in which a high-side power MOSFET chip, a low-side power MOSFET chip and a driver IC chip driving them are sealed in one sealing material (a capsulating insulation resin), a wiring length of a wiring DL connecting an output terminal of the driver IC chip to a gate terminal of the low-side power MOSFET chip or a source terminal is made shorter than a wiring length of a wiring DH connecting the output terminal of the driver IC chip to a gate terminal of the high-side power MOSFET chip or a source terminal. Further, the number of the wiring DL is made larger than the number of the wiring DH.

11 Claims, 20 Drawing Sheets

US 8,044,520 B2

SEMICONDUCTOR DEVICE

CROSS-REFERENCE TO RELATED APPLICATION

The present application claims priority from Japanese Patent Application No. JP 2006-048577 filed on Feb. 24, 2006, the content of which is hereby incorporated by reference into this application.

TECHNICAL FIELD OF THE INVENTION

The present invention relates to a semiconductor device technique more particularly, to a technique effectively applied to a semiconductor device having a power supply circuit.

BACKGROUND OF THE INVENTION

As one example of a semiconductor device having a power supply circuit, there is a DC-DC converter. For example, Published Japanese Translation of a PCT Application No. 2003-528449 (Patent Document 1) discloses a multi-chip module (hereinafter, referred to as MCM) which includes a MOSFET (metal oxide semiconductor field-effect transistor) gate driver, two power MOSFETs, and a relevant passive element including an input condenser, all of which are installed on a ball grid array substrate, and is packaged in a single chip.

Further, for example, Japanese Patent Application Laid-Open Publication No. 2004-342735 (Patent Document 2) discloses a semiconductor device provided with a power MOS-FET for a high-side switch, a power MOS-FET for a low-side switch, and a driver IC driving the power MOS-FET corresponding to power IC used for a non-isolated DC-DC converter in one package.

Further, for example, Japanese Patent Application Laid-Open Publication No. 2005-217072 (Patent Document 3) discloses an MCM in which a controlling power MOSFET chip, a synchronizing power MOSFET chip electrically connected to the controlling power MOSFET chip in series by a plate-shaped conductor member, and a driver IC chip turning on and off an operation of the chips are sealed in a sealing material.

SUMMARY OF THE INVENTION

The DC-DC converter widely used as one example of the semiconductor device having the power supply circuits has a structure in which the high-side power MOSFET and the low-side power MOSFET are connected in series. The high-side power MOSFET has a switch function for controlling the DC-DC converter, the low-side power MOSFET has a switch function for synchronous rectification, and these two power MOSFETs are alternately turned on and off while synchronizing, thereby executing a conversion of a power supply voltage.

In this case, the non-isolated DC-DC converter used in the power supply circuits of a desktop type personal computer, a server, a game machine and the like tends to require large current and high frequency in correspondence to low voltage requirement and large current requirement of a CPU (Central Processing Unit) to be driven or the like, and a downsizing requirement of passive components such as a choke coil, input and output condensers and the like.

However, under the large current, a voltage of an output terminal Lx of the MCM is rapidly increased at a time when the high-side power MOSFET is turned on. Accordingly, a gate voltage of the low-side power MOSFET bumps up on the basis of a capacitance coupling, and there is generated a "self turn-on" in which an on-state is erroneously formed. Since the high-side and low-side MOSFET are simultaneously turned on, a shoot-through current flows between an input power supply and a ground, and a superfluous loss is created. Under a condition of high frequency, there is a problem that a frequency of the shoot-through is increased, and a great loss is caused.

As a result of study by the inventors of the present invention, in order to suppress the self turn-on, it is effective to reduce a ratio Crss/Cgs, i.e., between a reverse transfer capacitance of the low-side power MOSFET Crss and a gate-source capacitance Cgs. However, since a ratio di/dt becomes larger due to the large current requirement and surge voltage at a time of turning on is increased in accordance therewith, countermeasures only by device structures are insufficient.

However, since the conventional MCM as mentioned above has attached importance rather to a reduction of a switching loss than a suppression of the self turn-on, although it is possible to reduce an inductance of a wiring connecting an output terminal of the driver IC and a gate terminal of the high-side power MOSFET, there has not been provided further insights into mounting for reducing a wiring inductance of a wiring connecting the output terminal of the driver IC and the terminal of the low-side power MOSFET.

An object of the present invention is to provide a technique which can reduce a loss of a power supply having a large current and a high frequency.

The above and other objects and novel characteristics of the present invention will be apparent from the description of this present specification and the accompanying drawings.

The typical ones of the inventions disclosed in this specification will be briefly described as follows.

That is, according to the present invention, there is provided a semiconductor device having a high-side power MOSFET chip, a low-side power MOSFET chip, and a driver IC chip to drive them, wherein a length of a first conductive member connecting an output terminal of the driver IC chip and a terminal of the low-side power MOSFET is made shorter than a length of a second conductive member connecting the output terminal of the driver IC chip and a terminal of the high-side power MOSFET chip.

The effects obtained by typical aspects of the present invention will be briefly described below.

That is, according to the present invention, since a parasitic inductance of the first conductive member is reduced and it is possible to suppress self turn-on by making the length of the first conductive member short, it is possible to make a loss of a large current and high frequency power supply low.

BRIEF DESCRIPTIONS OF THE DRAWINGS

Figure 21A:
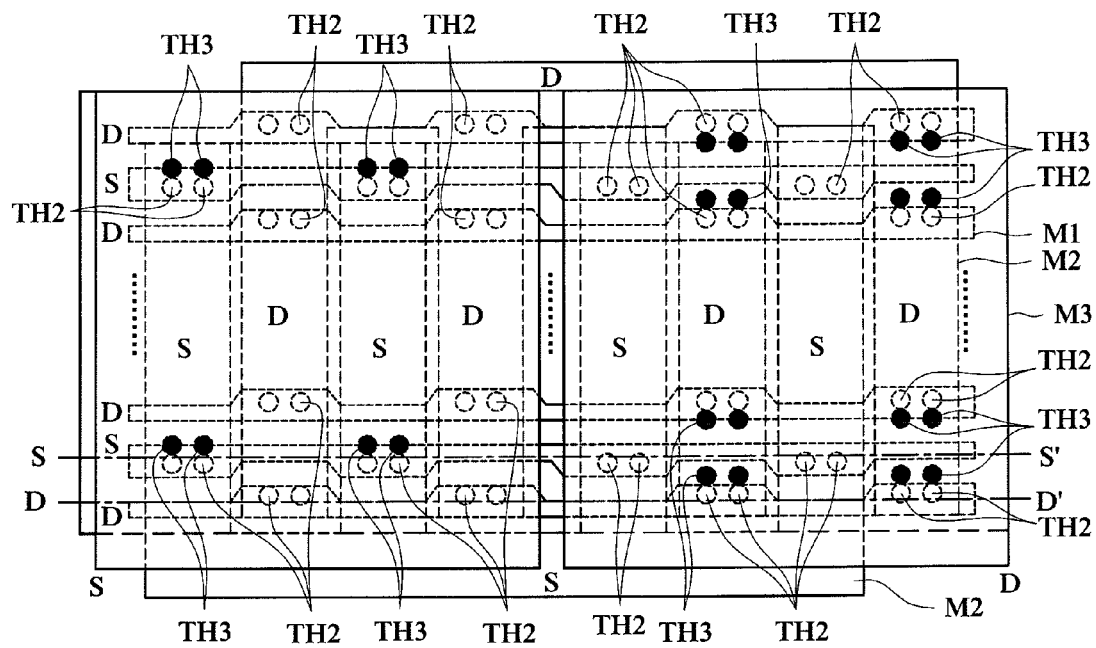
FIG. 21A is a schematic plan view showing an output stage n-channel type power MOSFET of a driver IC chip 30 mounted to a multi-chip module according to an Embodiment 8 of the present invention as seen from an upper surface.
Figure 23:
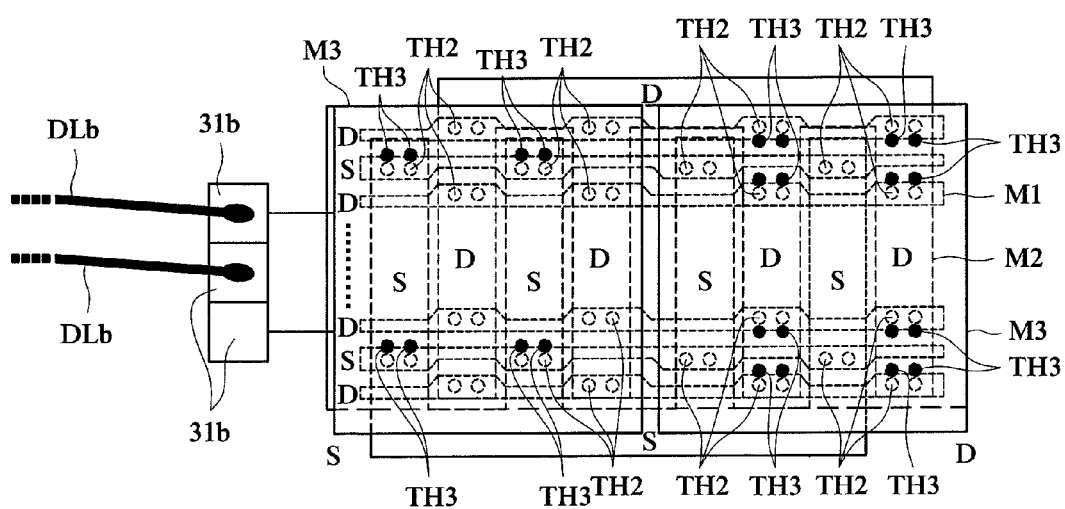
Figure 24A:
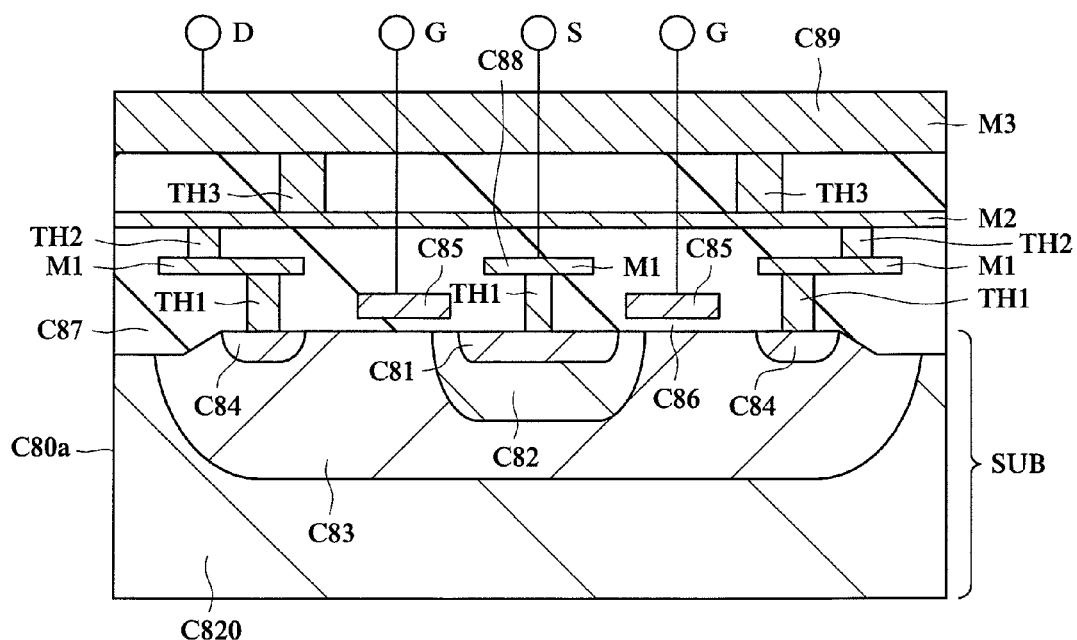
Figure 24B:
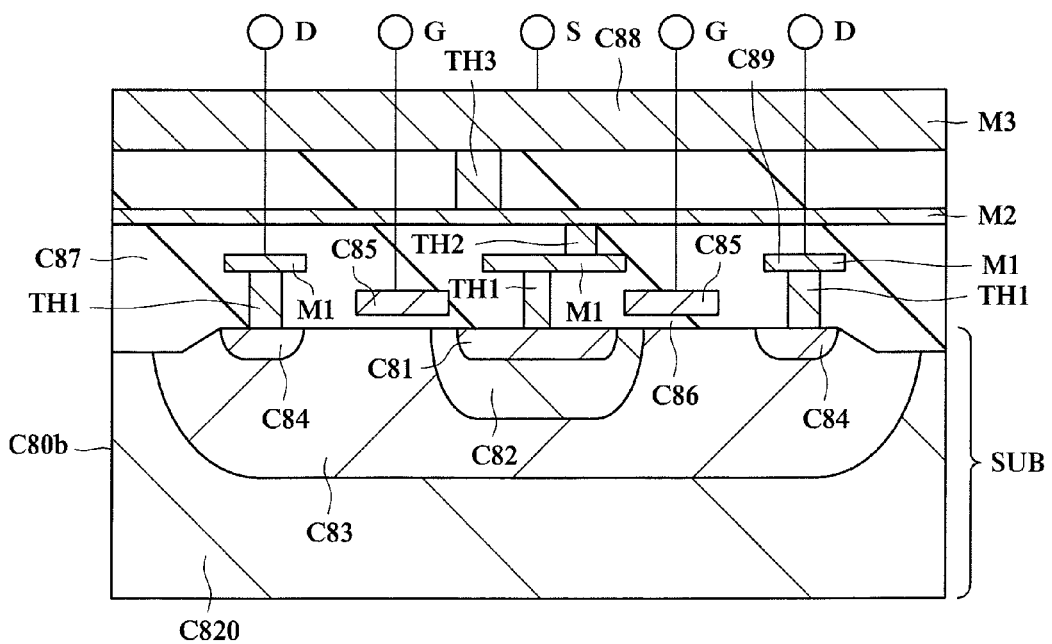

FIG. 23 is a schematic plan view showing a connection state between the output stage n-channel type power MOSFET driving a gate of the low-side power MOSFET chip 30 and an output terminal 31*b* on the driver IC chip 30;

FIG. 24A is a cross sectional view showing a unit cell structure of the output stage n-channel type power MOSFET shown in FIG. 21A; and FIG. 24B is a cross sectional view showing a unit cell structure of the output stage n-channel type power MOSFET shown in FIG. 21A.

DESCRIPTIONS OF THE PREFERRED EMBODIMENTS

In the following embodiments, a description will be given by dividing into a plurality of sections or embodiments as occasion demands as a matter of convenience, however, they are not independent from each other except any particularly provided expressly, and are in a relation that one is a modified example of a part or an entire of the other, a detail, a supplementary explanation or the like thereof.

Further, in the following embodiments, in the case of referring to a number and the like (including a number, a numerical value, an amount, a range and the like) of elements, the number is not limited to a specific number except a particularly defined case and a case of being limited to a specific number in principle, but may be equal to or more than the specific number or equal to or less than the specific number.

Note that components having the same function are denoted by the same reference symbols throughout the drawings for describing the embodiment, and the repetitive description thereof will be omitted. Hereinafter, embodiments of the present invention will be described in detail with reference to the accompanying drawings.

Embodiment 1

Figure 1:
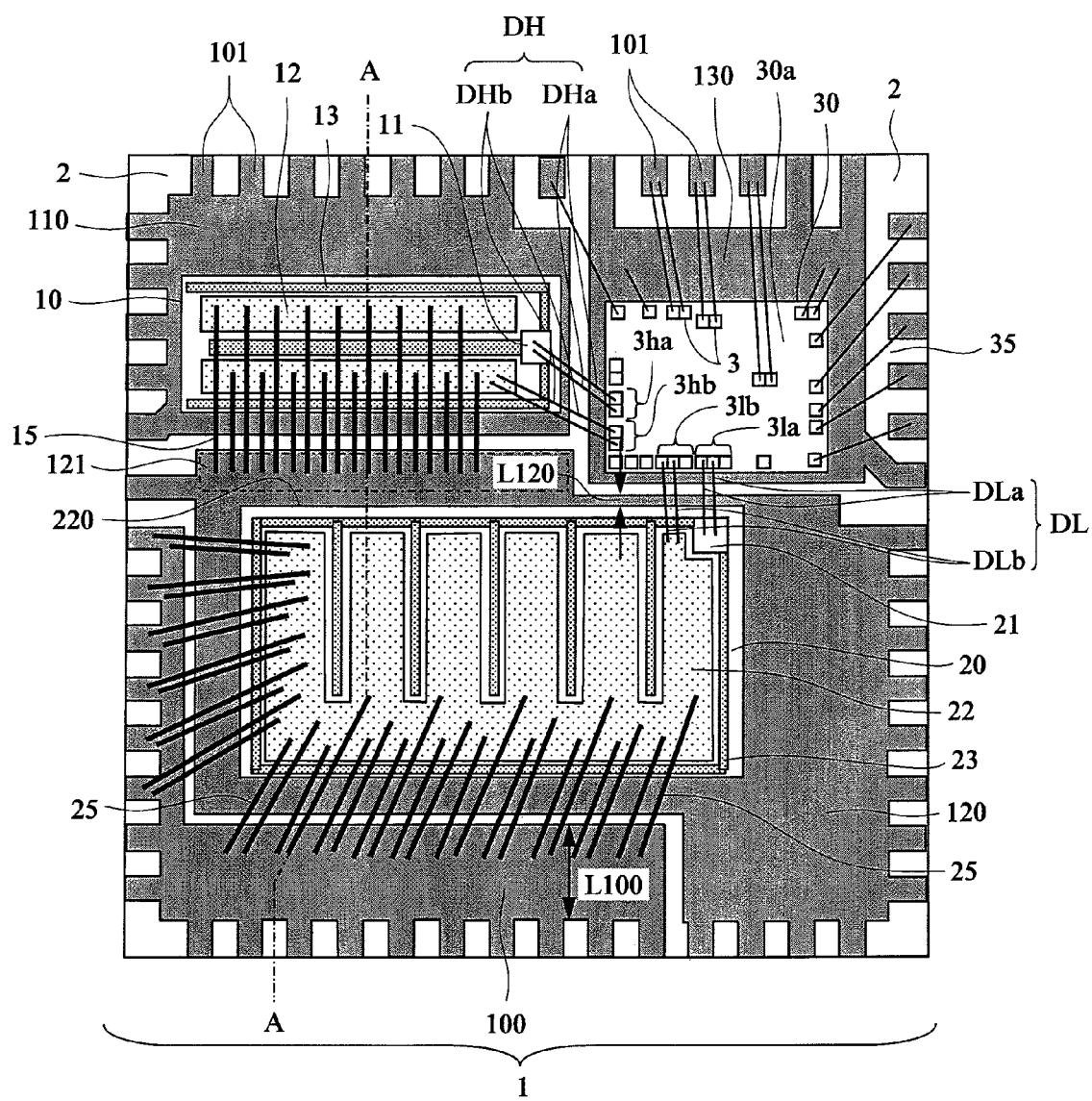
FIG. 1 is a plan view showing a multi-chip module according to an Embodiment 1 of the present invention through a sealing material.
Figure 2:
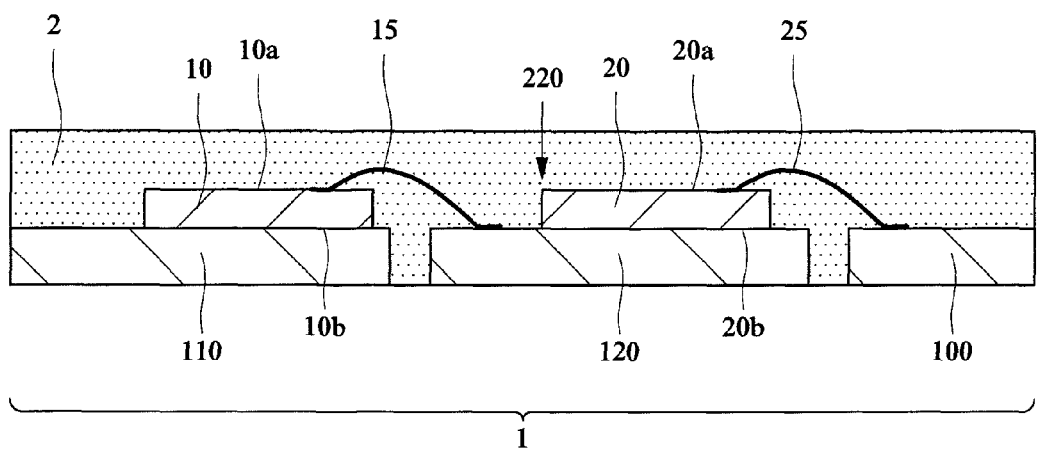
FIG. 2 is a cross sectional view showing a structure of the multi-chip module according to an Embodiment 1 of the present invention cut along the line A-A in FIG. 1.
Figure 3:
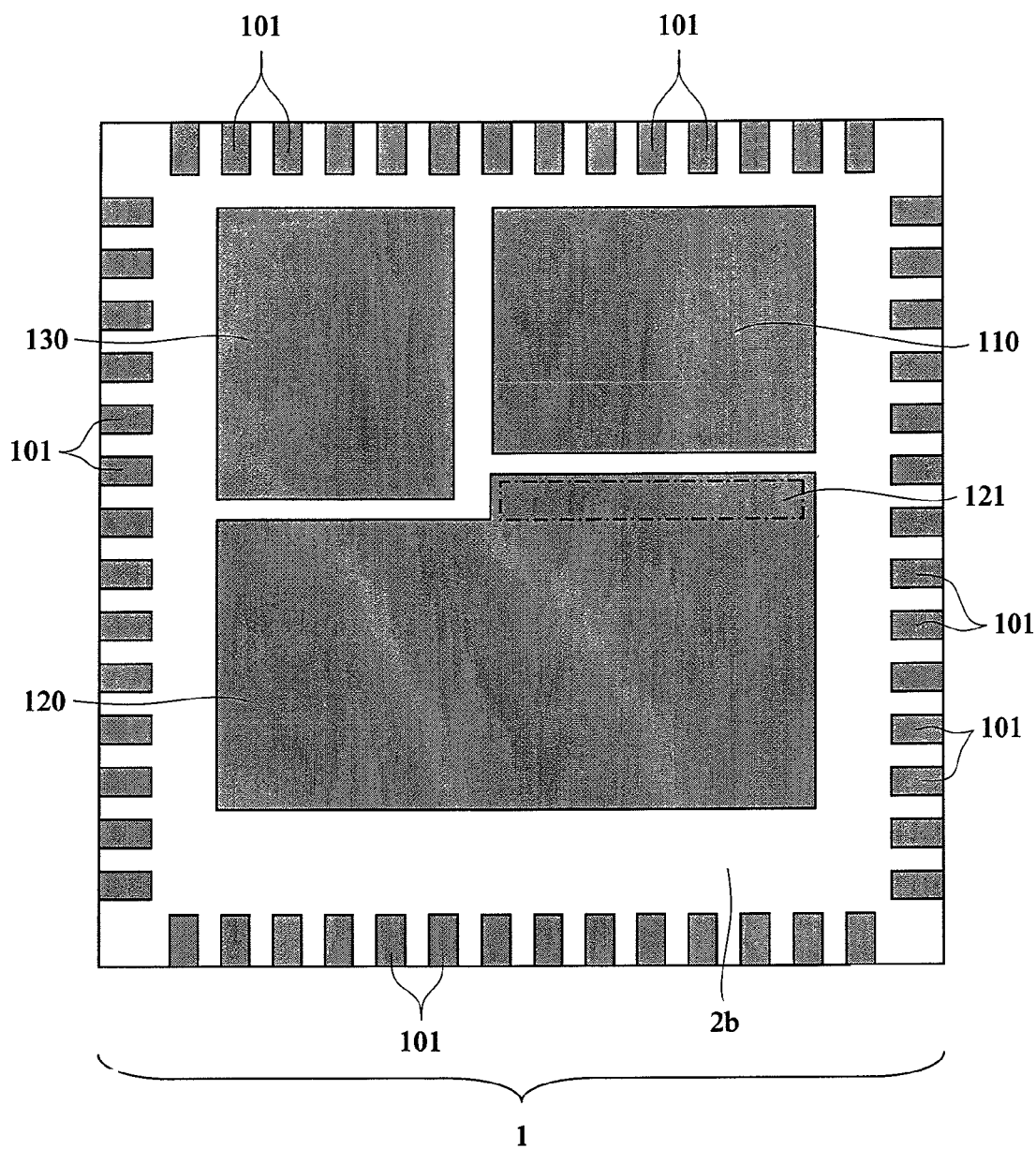
FIG. 3 is a plan view showing a structure of a back surface of the multi-chip module shown in FIG. 1.
Figure 4:
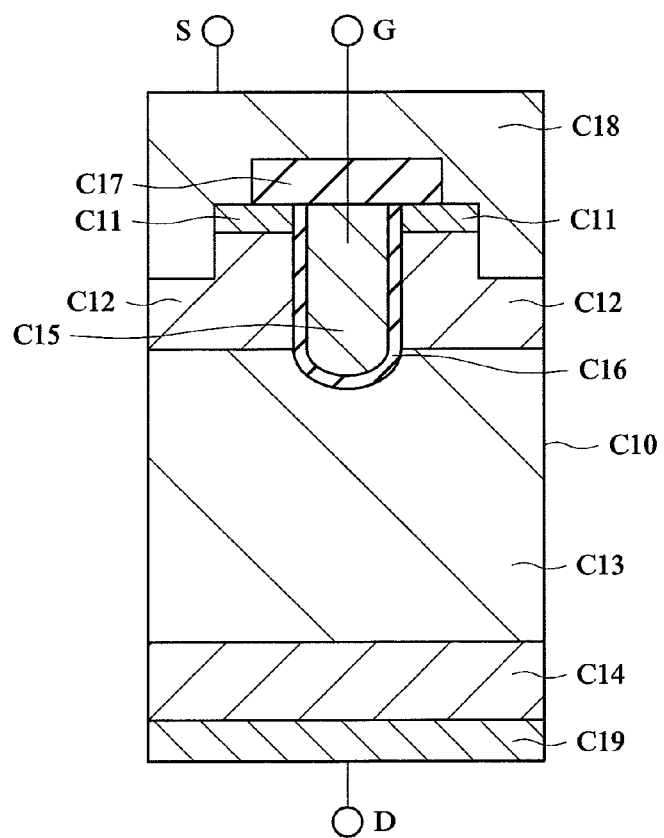
FIG. 4 is a schematic cross sectional view showing a unit cell structure of an n-channel type vertical field effect transistor used in a high-side power MOSFET of the multi-chip module.
Figure 5:
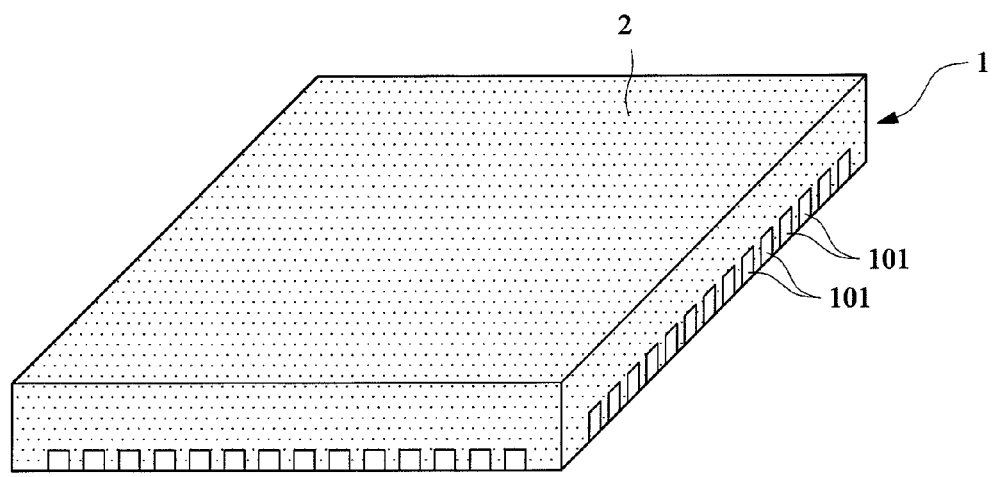
FIG. 5 is an outer appearance perspective view showing a structure of the multi-chip module shown in FIG. 1.
Figure 6:
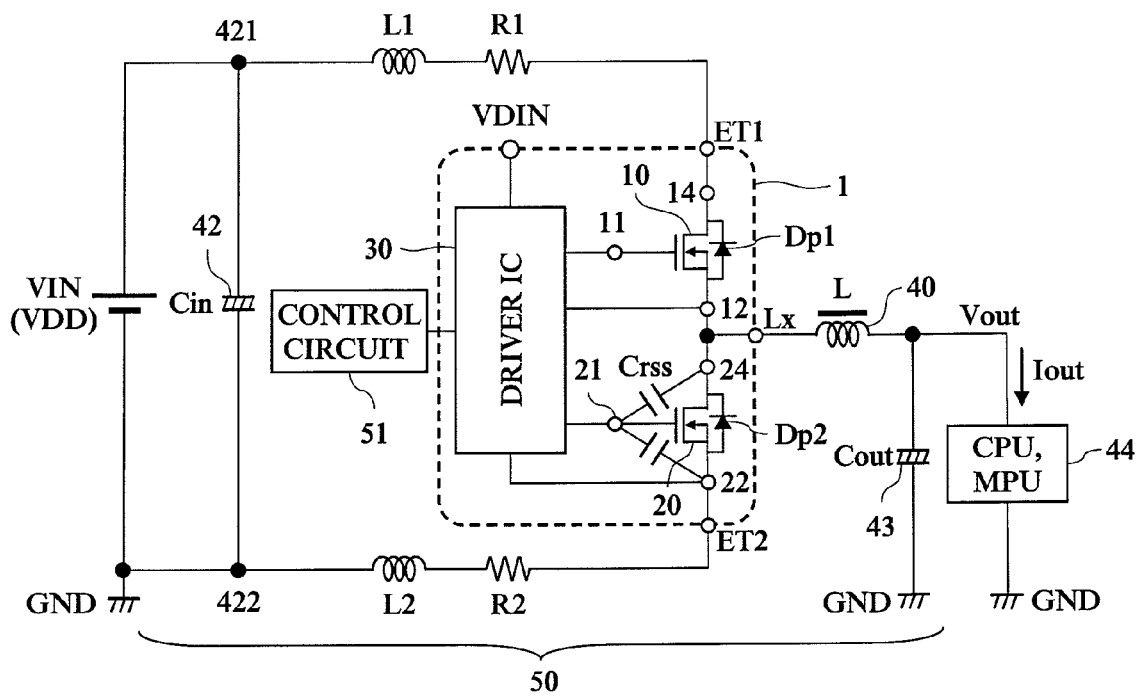
FIG. 6 is a circuit diagram showing an example of an equivalent circuit of a non-isolated DC-DC converter using the multi-chip module shown in FIG. 1.

FIG. 1 is a plan view showing an MCM (multi-chip module) 1 corresponding to a semiconductor device according to an embodiment 1 of the present invention through a sealing material on a front surface thereof, FIG. 2 is a cross sectional view showing a structure of a cross section of the MCM cut along the line A-A shown in FIG. 1, FIG. 3 is a plan view showing a structure of a back surface of the MCM 1 shown in FIG. 1, FIG. 4 is a schematic cross sectional view showing a unit cell structure of an n-channel type vertical field effect transistor used in a high-side power MOSFET chip of the MCM 1, FIG. 5 is an outer appearance perspective view of the MCM 1, and FIG. 6 is a circuit diagram showing an example of an equivalent circuit of a non-isolated DC-DC converter using the MCM 1 shown in FIG. 1.

The semiconductor device according to the embodiment 1 shown in FIGS. 1 to 6 is structured such that a plurality of semiconductor chips are sealed in one sealing material (an isolation resin for encapsulation) 2, and in the present embodiment 1, a description will be given by employing the MCM 1 for the non-isolated DC-DC converter as one example of the semiconductor device.

In this case, the MCM 1 according to the present embodiment is formed as a non-lead QFN (Quad Flat Non-leaded package) structure in which a plurality of external connection terminals 101 are arranged in a peripheral edge portion of a back surface 2b of the sealing material 2, as shown in FIGS. 3 and 5.

A description will be given of a basis feature of the MCM 1 according to the present embodiment 1. In FIGS. 1 and 2, the MCM 1 has a high-side power MOSFET chip 10 (a high-side switching device) for control corresponding to a first semiconductor chip, a low-side power MOSFET chip 20 (a low-side switching device) for synchronizing corresponding to a second semiconductor chip, and a driver IC chip 30 controlling on and off operations of the high-side power MOSFET chip 10 and the low-side power MOSFET chip 20, and these three semiconductor chips 10, 20 and 30 are sealed (encapsulated) in the sealing material 2.

Both of the high-side power MOSFET chip 10 and the driver IC chip 30 are arranged in such a manner as to have a side surface facing the low-side power MOSFET chip 20.

Further, an output terminal 31a of the driver IC chip 30 is connected to a gate terminal 21 of the low-side power MOSFET chip 20 via a wiring DLa (a first wiring), and an output terminal 31b of the driver IC chip 30 is connected to a source terminal 22 of the low-side power MOSFET chip 20 via a wiring DLb (a second wiring).

Further, an output terminal 3ha of the driver IC chip 30 is connected to a gate terminal 11 of the high-side power MOSFET chip 10 via a wiring DHa, and an output terminal 3hb of the driver IC chip 30 is connected to a source terminal 12 of the high-side power MOSFET chip 10 via a wiring DHb. Further, they are arranged in such a manner that a wiring length of the wiring DL (a first conductive member) of the MCM 1 becomes shorter than a wiring length of a wiring DH (a second conductive member).

In this case, in the present embodiment, a description will be given by setting a generic name of the wiring DLa and the wiring DLb to a wiring DL, and setting a generic name of the wiring DHa and the wiring DHb to a wiring DH. Accordingly, in principle, an expression of the wiring DL means any one of the wiring DLa and the wiring DLb, or both of them, and an expression of the wiring DH means any one of the wiring DHa and the wiring DHb or both of them.

For example, in the case that the wiring length of any one or both of the wiring DLa and the wiring DLb is shorter than the wiring length of any one or both of the wiring DHa and the wiring DHb, it is described as "the wiring DL is shorter than the wiring DH" in the following description. This expression will be applied to all the descriptions after the description of the present embodiment, except a particularly defined case.

In this case, a description will be given of results discussed by the inventors of the present invention about a main loss created in the MCM 1 used in a power supply circuit, with reference to FIG. 6 showing an equivalent circuit of a non-isolated DC-DC converter 50 at a time of mounting the MCM 1 shown in FIG. 1 to a power supply.

A non-isolated DC-DC converter 50 comprises elements such as a control circuit 51, the MCM 1, an input condenser 42, an output condenser 43, a coil 40 and the like.

The control circuit 51 is constituted, for example, by a pulse width modulation (PWM) circuit, and supplies a signal controlling a voltage switch-on width (an on time) of the power MOSFET chips 10 and 20. An output (a terminal for a control signal) of the control circuit 51 is electrically connected to an input of the driver IC chip 30.

Outputs (output terminals 3ha, 3hb, 31a and 31b in FIG. 1) of the driver IC chip 30 are electrically connected to the gate terminal 11 and the source terminal 12 of the high-side power MOSFET chip 10, and the gate terminal 21 and the source terminal 22 of the low-side power MOSFET chip 20, respectively.

The driver IC chip 30 is a circuit controlling electric potentials of the gate terminals 11 and 21 of the power MOSFET chips 10 and 20 on the basis of the control signal supplied from the control circuit 51, and turning on and off operations of the power MOSFET chips 10 and 20. In this case, reference symbol VDIN indicates an input power supply of the driver circuit.

The high-side power MOSFET chip 10 corresponds to a power transistor for a high-side switch, and has a switch function for storing an energy in a coil 40 supplying an electric power to an output of the non-isolated DC-DC converter (an input of a load circuit 44).

The low-side power MOSFET chip 20 corresponds to a power transistor for a low-side switch, corresponds to a rectifying transistor of the non-isolated DC-DC converter 50, and has a function executing a rectification by lowering a resistance of the transistor in synchronous with a turn-off operation according to the output signal of the control circuit 51.

The power MOSFET chips 10 and 20 mentioned above are arranged in series between a terminal ET1 (a first power supply terminal) for supplying a high potential (a first power supply potential) VDD of an input power supply VIN, and a terminal ET2 (a second power supply terminal) for supplying a reference potential (a second power supply potential) GND.

In other words, the high-side power MOSFET chip 10 is structured such that a source-drain path thereof is connected in series between the terminal ET1 for supplying the high potential VDD of the input power supply VIN and an output node Lx, and the low-side power MOSFET chip 20 is structured such that a source-drain path thereof is connected in series between the output node Lx and the terminal ET2 for supplying the reference potential GND.

In this case, the output node Lx in FIG. 6 corresponds to an output side plate lead portion 120 and a wire 15 connected to the output side plate lead portion 120 in FIG. 1.

In this case, the power supply potential VDD for input of the input power supply VIN is, for example, about 5 to 12 V. Further, the reference potential GND is lower than the power supply potential for input, and is, for example, 0 V of ground potential. Further, an operation frequency (a frequency at a time of turning on and off the power MOSFET chips 10 and 20) of the non-isolated DC-DC converter 50 is, for example, 1 MHz. As the load circuit 44, there can be exemplified a CPU (Central Processing Unit) or an MPU (Micro Processing Unit) of an electronic device such as a server, a personal computer, a game machine or the like.

Reference symbols Iout and Vout respectively denote an output current and an output voltage of the non-isolated DC-DC converter 50. The output current Iout and the output voltage Vout are, for example, about 1 to 30 A, and about 0.6 to 1.3 V.

Further, FIG. 6 illustrates a parasitic diode Dp1 (an internal diode) of the high-side power MOSFET chip 10, a parasitic diode Dp2 (an internal diode) of the low-side power MOSFET chip 20, a reverse transfer capacitance Crss corresponding to a parasitic capacitance of the low-side power MOSFET, and a gate-source capacitance Cgs.

As a loss created in the MCM 1, there are, 1) switching loss, 2) recovery loss, 3) power MOSFET conduction loss, 4) diode conduction loss, 5) driver loss and 6) loss of wiring resistance portion.

The switching loss corresponds to a loss at a time when the high-side power MOSFET turns on and off, and is constituted by an integrated value of [current×voltage] until the current and the voltage are changed to a stationary on state from a state of turning on, or until they are changed to a stationary off state from a state of turning off. Accordingly, in order to reduce the switching loss, there is employed the high-side power MOSFET having a high-speed switching operation in which a transition time of the current and the voltage is short.

In addition, an induced voltage=[parasitic inductance of wiring×time change rate of current] is created in the parasitic inductance existing in the wiring portion of the power supply circuit, on the basis of the current change at a time of switching. On the basis of the induced voltage, the source-drain voltage of the low-side power MOSFET is increased at a time of turning on, and the source-drain voltage of the high-side power MOSFET is increased at a time of turning off. Accordingly, the switching loss is enlarged.

Therefore, it is possible to reduce the switching loss by reducing the parasitic inductance L1 between a node 421 and the terminal ET1 for supplying the VDD, the parasitic inductance L2 between a node 422 and the terminal ET2 for supplying the GND, and the parasitic inductance (not shown) existing between the terminal ET1 and the terminal ET2.

In the MCM 1, since the high-side power MOSFET chip 10 and the low-side power MOSFET chip 20 are integrated within one package, it is possible to shorten the wiring lengths between the high-side and low-side power MOSFETs, between the high-side power MOSFET and the terminal ET1, and between the low-side power MOSFET and the ET2. Accordingly, the parasitic wiring inductance and the parasitic wiring resistance become smaller, and the loss becomes lower than the case that the power supply circuit is assembled by a discrete part.

The recovery loss corresponds to a loss created by a matter that the conductive state is kept for a while and the current (the recovery current) keeps flowing even in a state in which the voltage is applied in a reverse direction just after the high-side power MOSFET is turned on, on the basis of a reverse recovery characteristic of the parasitic diode Dp2 which flowed the current in a forward direction.

If the recovery current starts being reduced, the voltage of the output node Lx starts being increased. If the voltage of the output node Lx is increased, the gate voltage (the voltage of the node 21) of the low-side power MOSFET is increased due to a capacitance coupling via the reverse transfer capacitance Crss corresponding to the parasitic capacitance of the low-side power MOSFET. Further, the increased gate voltage gets over a threshold voltage of the low-side power MOSFET, there is created a so-called "self turn-on" state in which the low-side power MOSFET which was kept in the off state is turned on.

If the "self turn-on" is created, the high-side and low-side power MOSFETs are simultaneously turned on. Accordingly, since a shoot-through current flows from the terminal ET1 for supplying the high potential VDD to the terminal ET for supplying the reference potential GND, a great loss is created. The shoot-through current starts flowing in the middle of reduction of the recovery current, and the loss created by the both is hard to be separated. Accordingly, in FIG. 8 described later, both the losses are combined so as to be treated as the recovery loss.

The power MOSFET conduction loss corresponds to a loss created by an on resistance of the power MOSFET at a time when each of the high-side power MOSFET and the low-side power MOSFET is in the stationary on state. In a step-down type switching power supply mentioned in the present invention, since the on period of the low-side power MOSFET is longer than that of the high-side power MOSFET so as to more greatly affect the loss, a low on resistance is particularly required in the low-side power MOSFET.

Briefly describing the other losses than the losses mentioned above, a diode conduction loss corresponds to a loss created by a product of a return current flowing in the parasitic diode Dp2 of the low-side power MOSFET during a period (a dead time 1) until turning on the high-side power MOSFET after turning off the low-side power MOSFET, and a period (a dead time 2) until turning on the low-side power MOSFET after turning off the high-side power MOSFET, and the voltage in the forward direction of the diode.

A driver loss corresponds to a loss of the driver IC, and is mainly constituted by a loss created at a time of charging and discharging the gate of the power MOSFET for turning on and off the power MOSFET. A loss of the wiring resistance portion corresponds to a conduction loss created in the parasitic resistance (not shown) of the wiring portion existing between the terminal ET1 and the terminal ET2.

Next, a description will be given with reference to FIGS. 7 to 9, of an influence affected to the losses mentioned above by the parasitic inductance of the wiring DH, the parasitic inductance of the wiring DL, and the on resistance of the driver IC chip 30, which was discussed and found by the inventors of the present invention.

Figure 7:
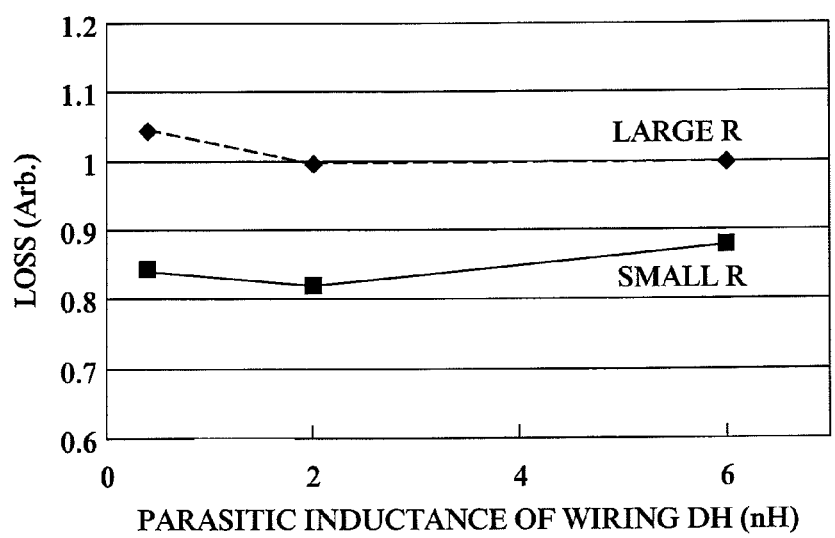
FIG. 7 is a graph showing a relation between a parasitic inductance of a wiring DH and a switching loss.
Figure 8:
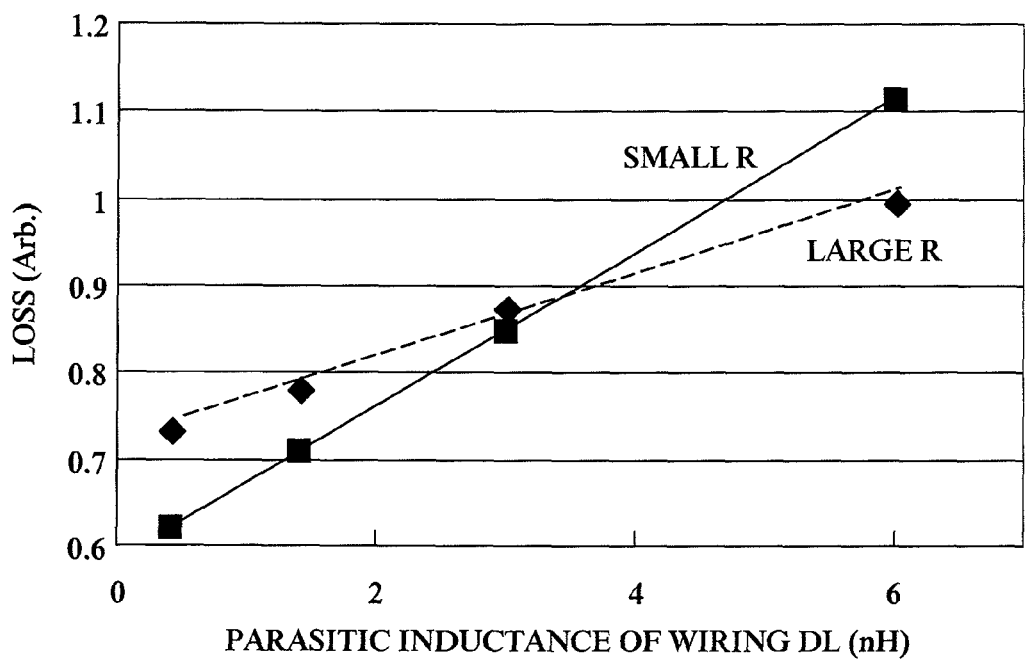
FIG. 8 is a graph showing a relation between the parasitic inductance of the wiring DL and a loss at a time of recovery.

FIG. 7 is a graph showing a relation between the parasitic inductance of the wiring DH and the switching loss, and FIG. 8 is a graph showing a relation between the parasitic inductance of the wiring DL and the recovery loss, each of which shows a case (large R) that the on resistance of the driver IC chip 30 is large, and a case (small R: 40% reduction from large R) that it is small. FIG. 9 is a graph showing a relation between a gate surge voltage of the low-side power MOSFET chip 20 and the parasitic inductance of the wiring DL. In this case, each of FIGS. 7, 8 and 9 is determined by the inventors of the present invention on the basis of a calculation, and the parasitic inductances of the wirings DHb and DLb are treated as the same as the parasitic inductances of the wirings DHa and DLa.

In FIG. 7, when the parasitic inductance of the wiring DH is reduced from 6 nH, the switching loss is hardly changed until 2 nH in the case of the large R, and the loss is increased thereunder. In the case of the small R, the loss is some percent reduced until 2 nH, however, is increased thereunder. The switching loss is largely changed by 10% to 20% on the basis of the on resistance of the driver IC chip 30 which drives the gate terminal 11 of the high-side power MOSFET chip 10.

On the contrary, in FIG. 8, when the parasitic inductance of the wiring DL is reduced from 6 nH, the loss at a time of the recovery is reduced in both the cases that the on resistance of the driver IC chip 30 which drives the gate terminal 21 of the low-side power MOSFET chip 20 is large (large R) and small (small R), and a reduction rate thereof is larger in the small R. If the inductance is reduced to 0.4 nH, the recovery loss is reduced by 27% in the large R, and by 44% in the small R.

As mentioned above, as a result of the study by the inventors of the present invention, it is found that the loss depends on the on resistance of the driver IC chip 30 in the high-side, and is not largely affected by the parasitic inductance of the wiring DH.

On the other hand, in FIG. 8, it is found that the loss is affected by the parasitic inductance of the wiring DL in the low-side, and when the parasitic inductance of the wiring DL is reduced, an effect of reducing the loss can be obtained. Further, it is found that it is possible to obtain a further great loss reduction effect when the on resistance of the driver IC chip 30 is reduced (small R) at a time of reducing the parasitic inductance of the wiring DL.

Figure 9:
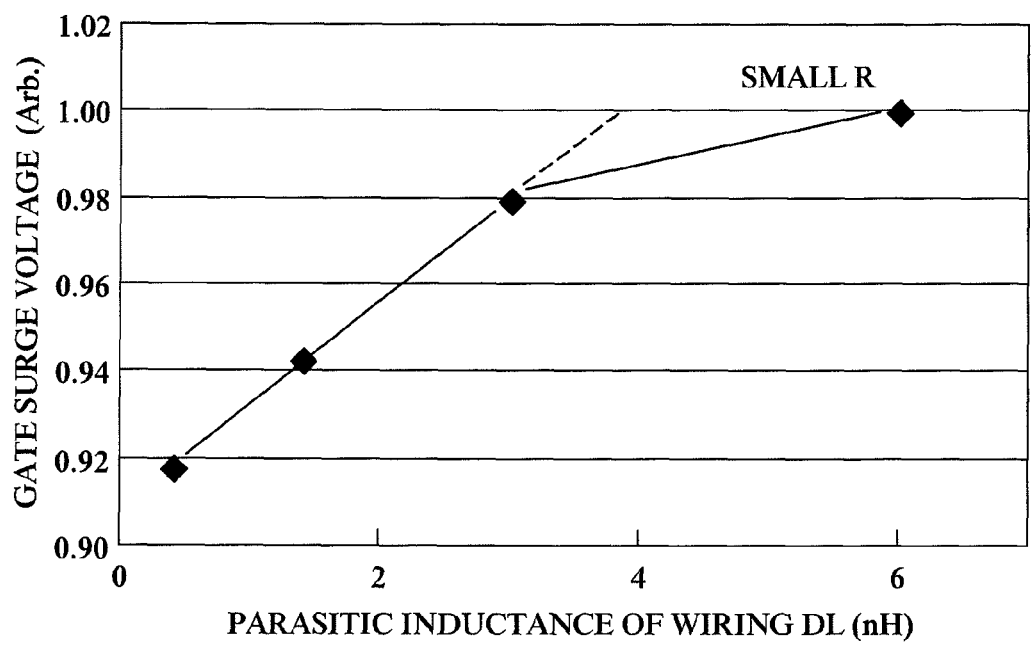
FIG. 9 is a graph showing a relation between the parasitic inductance of the wiring DL and a gate surge voltage of the low-side power MOSFET.

A reason of the loss at a time of the recovery is reduced depends on a matter that the gate surge voltage of the low-side power MOSFET chip 20 at a time of turning on is reduced by lowering the wiring inductance, whereby the self turn-on is suppressed, as shown in FIG. 9.

In this case, in FIG. 9, an increase rate of the gate surge voltage is reduced in the case that the parasitic inductance of the wiring DL is between 3 nH and 6 nH, in comparison with the case that it is between 0.4 nH and 3 nH. This depends on a matter that an increasing degree of the self turn-on under a condition that the parasitic inductance is large, and the shoot-through current flowing to the terminal ET2 for supplying GND from the terminal ET1 for supplying VDD is increased, thereby suppressing the voltage increase of the output node Lx of the MCM 1 at a time of turning on, and the bump-up of the gate voltage is suppressed accompanying therewith.

In accordance with FIG. 8, the loss becomes lower in the small R in the case that the parasitic inductance is equal to or less than about 3 nH. Since the parasitic inductance of the wiring is about 1 nH per 1 mm in one wiring, the loss reduction effect by the low on resistance of the driver IC chip 30 appears when the wiring length of the wiring DL is set to equal to 1.5 mm (=3 mm÷2) or less.

Further, since the parasitic inductance is reduced to be about one half when the wire wiring is set to two, and is reduced to be about one third when it is set to three, it is possible to reduce a combined parasitic inductance of the wiring DLa and a combined parasitic inductance of the wiring DLb to a sub-nH when the number of wirings of the wiring DLa and the wiring DLb are respectively made equal to or more than two, and it is possible to increase a suppressing effect of the self turn-on.

In this case, two or more of the wiring number may be applied to any one of the wiring DLa and the wiring DLb or both of them. It is possible to increase the suppressing effect of the self turn-on in correspondence to the number.

As mentioned above, the inventors of the present invention found that, the parasitic inductance of the wiring DH does not affect very much for reducing the loss of the MCM 1, the on resistance of the driver IC chip 30 and the parasitic inductance of the wiring DL largely affects, and the larger influence is obtained by combining the reduction of the on resistance of the driver IC chip 30 and the reduction of the parasitic inductance of the wiring DL.

Further, according to the present embodiment 1, since it is possible to reduce the parasitic inductance of the wiring DL by making the wiring length of the wiring DL shorter than the wiring length of the wiring DH as mentioned above, it is possible to increase the suppressing effect of the self turn-on and it is possible to lower the loss of the large current and high frequency power supply.

In this case, the description is given by setting the wiring DL to the wiring in the present embodiment 1, however, a metal plate, for example, a copper, an aluminum or the like may be employed as the wiring DL. Since it is possible to reduce the parasitic inductance and the resistance of the wiring DL by using the metal plate, it is possible to lower the loss.

Further, it is needless to say that the metal plate, for example, the copper, the aluminum or the like may be employed for the wiring DH.

A description will be given for the other features of the MCM 1 according to the present embodiment 1. As shown in FIGS. 1 and 2, the high-side power MOSFET chip 10 for control is electrically connected onto an input side plate lead portion 110 corresponding to a first plate conduction member. In other words, a terminal portion (not shown) forming a drain terminal 14 of the high-side power MOSFET for control is formed on a back surface 10b of the high-side power MOSFET chip 10 for control, and the input side plate lead portion 110 is connected to the drain terminal 14 via a die bonding material, for example, a silver paste or the like.

On the other hand, on a main surface 10a (a front surface) having the gate terminal of the high-side power MOSFET chip 10 for control, there are formed a terminal portion for forming the source terminal 12 and the gate terminal 11 of the high-side power MOSFET for control, and the gate finger 13.

Further, the low-side power MOSFET chip 20 for synchronizing is electrically connected onto an output side plate lead portion 120 corresponding to a second plate conduction member. In other words, a terminal portion (not shown) forming a drain terminal 24 of the power MOSFET for synchronizing is formed on a back surface 20b of the low-side power MOSFET chip 20 for synchronizing, and the output side plate lead portion 120 is connected to the drawn terminal 24 via a die-bonding material, for example, silver paste or the like.

On the other hand, on a main surface 20a having the gate terminal of the low-side power MOSFET chip 20 for synchronizing, there are formed a terminal portion for forming the source terminal 22 and the gate terminal 21 of the low-side power MOSFET for synchronizing, and the gate finger 23.

Further, the MCM 1 has a driver side plate lead portion 130 corresponding to a third plate conduction member and a ground side plate lead portion 100 corresponding to a fourth plate conduction member, and the driver IC chip 30 is electrically connected onto the driver side plate lead portion 130. In other words, an electrode is formed on a back surface of the driver IC chip 30 (not shown), and the electrode and the diver side plate lead portion 130 are connected via a die-bonding material, for example, silver paste or the like.

A plurality of terminals 3 exist on a main surface 30a of the driver IC chip 30. Further, among the terminals 3, the terminal 31a and the gate terminal 21 of the low-side power MOSFET chip 20 for synchronizing, the terminal 31b and the source terminal 22 of the low-side power MOSFET chip 20 for synchronizing, the terminal 3ha and the gate terminal 11 of the high-side power MOSFET chip 10 for control, and the terminal 3hb and the source terminal 12 of the high-side power MOSFET chip 10 for control are electrically connected by wirings DLa, DLb, DHa, and DHb of a thin metallic wire, for example, gold wire and the like, respectively, and the terminals are used for control so as to turn on and off the respective power MOSFET.

The other terminals 3 on the main surface 30a of the driver IC chip 30 are respectively constituted by a power supply voltage terminal, a boot terminal, a voltage checking terminal, a control signal input terminal and the like, and are connected by the corresponding external connection terminal 101 and the wire 35.

As shown in FIG. 3, each of the input side plate lead portion 110, the output side plate lead portion 120 and the driver side plate lead portion 130 on which the respective semiconductor chips are mounted is partly or entirely exposed from the sealing material 2 on the back surface 2b of the sealing material 2 of the MCM 1, and serves not only as an external portion connecting terminal for electrically connecting to the printed mount board, but also as a heat radiating part to radiate heat to the printed mount board.

Further, as shown in FIG. 1, the low-side power MOSFET chip 20 is arranged in such a manner so as to have a side surface facing one side of the high-side power MOSFET chip 10 and one side of the driver IC chip 30, at the side of a first line 220 (a first line facing one side of the plane of the driver IC) corresponding to a long side of the low-side power MOSFET chip 20. Further, the output side plate lead portion 120 mounting the low-side power MOSFET chip 20 thereon is arranged in such a manner so as to face one side of the high-side power MOSFET chip 10 and one side of the driver IC chip 30.

In this case, a convex region 121 (a third facing region) is provided in the output side plate lead portion 120 in such a manner so as to protrude a region (a first facing region) toward the high-side power MOSFET chip 10 side rather than a region (a second facing region) opposing to the driver IC chip 30. Further, as shown in FIG. 2, the source terminal 12 of the main surface 10a (the front surface) side of the high-side power MOSFET chip 10 and the output side plate lead portion 120 are electrically connected to the convex region 121 via the wire 15.

By providing the convex region 121, it is possible to locate the low-side power MOSFET chip 20 close to the driver IC chip 30 without being limited by the connection region between the source terminal 12 of the high-side power MOSFET chip 10 and the output side plate lead portion 120. In other words, since it is possible to make the distance between the low-side power MOSFET chip 20 and the drive IC chip 30 shorter in comparison with the case that the convex region 121 is not provided, it is possible to shorten the wiring length of the wiring DL.

Further, the gate terminal 21 is provided in the first line 220 side of the low-side power MOSFET chip 20 facing the driver IC chip 30. With employment of the structure mentioned above, since it is possible to make the terminal distance between the output terminal 31a of the driver IC chip 30 and the gate terminal 21 of the low-side power MOSFET chip 20 shorter in comparison with the case that the gate terminal 21 is provided on the other lines than the first line 220 side, it is possible to shorten the wiring length of the wiring DLa.

According to the present embodiment 1, since it is possible to shorten the wiring length of the wiring DL, it is possible to reduce the parasitic inductance of the wiring DL.

In this case, it is possible to elongate the wiring lengths of the wiring DHa and DHb respectively connected to the gate terminal 11 and the source terminal 12 of the high-side power MOSFET chip 10 from the output terminals 3ha and 3hb of the driver IC chip 30 by providing the convex region 121. This is because the wiring inductance of the wiring DH does not affect the loss so much in comparison with the inductance of the wiring DL, as mentioned above.

Further, the source terminal 22 of the low-side power MOSFET chip 20 and the ground side plate lead portion 100 are electrically connected via the wire 25.

In this case, the structure is made in the output side plate lead portion 120, as shown in FIG. 1, such that a length L120 in the direction of the driver IC chip 30 of a region (a second facing region) facing the driver IC chip 30 becomes shorter than a length L100 in the direction of the low-side power MOSFET chip 20 of the ground side plate lead portion 100.

Since the length of L120 is made shorter than L100, the wire 25 does not become longer even by locating the low-side power MOSFET chip 20 close to the driver IC chip 30 side, and the parasitic inductance is hardly increased, accordingly, it is possible to suppress an increase of the switching loss.

FIG. 4 is a schematic cross sectional view showing a unit cell structure of an n-channel type vertical field effect transistor used in the high-side power MOSFET chip 10 of the MCM 1 according to the present embodiment 1.

The high-side power MOSFET chip 10 corresponds to a power transistor for a high-side switch, and has a switching function for storing an energy in the coil 40 which supplies the electric power to an output of the non-isolated type DC-DC converter 50 (an input of the load circuit 44). The high-side power MOSFET chip 10 is formed by the n-channel type vertical field effect transistor.

Reference symbol C10 denotes a unit cell, reference symbol C11 denotes an $n^+$ type semiconductor region, reference symbol C12 denotes a p type semiconductor region, reference symbol C13 denotes an $n^-$ type semiconductor region, reference symbol C14 denotes an $n^+$ type semiconductor region, reference symbol C15 denotes an $n^-$ polycrystalline semiconductor region forming the gate electrode, reference symbol C16 denotes a gate oxide film, reference symbol C17 denotes an insulating film, reference symbol C18 denotes a metal thin film (for example, an aluminum thin film) forming the source electrode, and reference symbol C19 denotes a metal thin film forming the drain electrode. A width of the unit cell C10 is about 1 to 2 micro meter, and the transistor portion of the high-side power MOSFET chip 10 is formed by arranging some thousands of unit cells. For example, a set of C18 forms the source terminal 12.

In this case, FIG. 4 schematically shows a state in which the terminal line is drawn out from the region forming the electrode for facilitate understanding of the electrode structure of the unit cell, respectively shown schematically such as S (source), G (gate) and D (drain).

In the unit cell C10, the current flows in a vertical direction from the drain electrode side (C19 side) to the source electrode side (C18 side). Since a vertical field effect transistor corresponds to a device in which the channel is formed in a thickness direction of the semiconductor chip, a channel width per a unit area can be increased and an on resistance can be reduced in comparison with a lateral field effect transistor, it is possible to made the device small so as to make the package compact. Further, in one chip size, since the on resistance is smaller in the n-channel type vertical field effect transistor in comparison with the p-channel type, it is possible to make the device small.

On the other hand, the low-side power MOSFET chip 20 corresponds to a power transistor for a low-side switch and a transistor for rectifying the non-isolated type DC-DC converter 50, and has a function of lowering the resistance of the transistor in synchronous with the turn-off operation in accordance with the output signal of the control circuit 51 to rectify. The low-side power MOSFET chip 20 is formed by the n-channel type vertical field effect transistor in the same manner as the high-side power MOSFET chip 10.

The reason for using the vertical type is as follows. Since an on-state time (a time for which the voltage is applied) of the low-side power MOSFET chip 20 is longer than an on-state time of the high-side power MOSFET chip 10, the conduction loss caused by the on resistance becomes larger than the switching loss, so that it is advantageous to use the vertical field effect transistor which can increase the channel width per the unit area in comparison with the lateral field effect transistor. Further, the reason for using the n-channel type is as follows. The on resistance of the n-channel type vertical field effect transistor is smaller than that of the p-channel type in one chip size.

In other words, since it is possible to make the on resistance small by forming the low-side power MOSFET chip 20 by the n-channel type vertical field effect transistor, it is possible to improve a voltage conversion efficiency even if the flowing current is increased in the non-isolated type DC-DC converter 50 of a space saving type.

Figure 10:
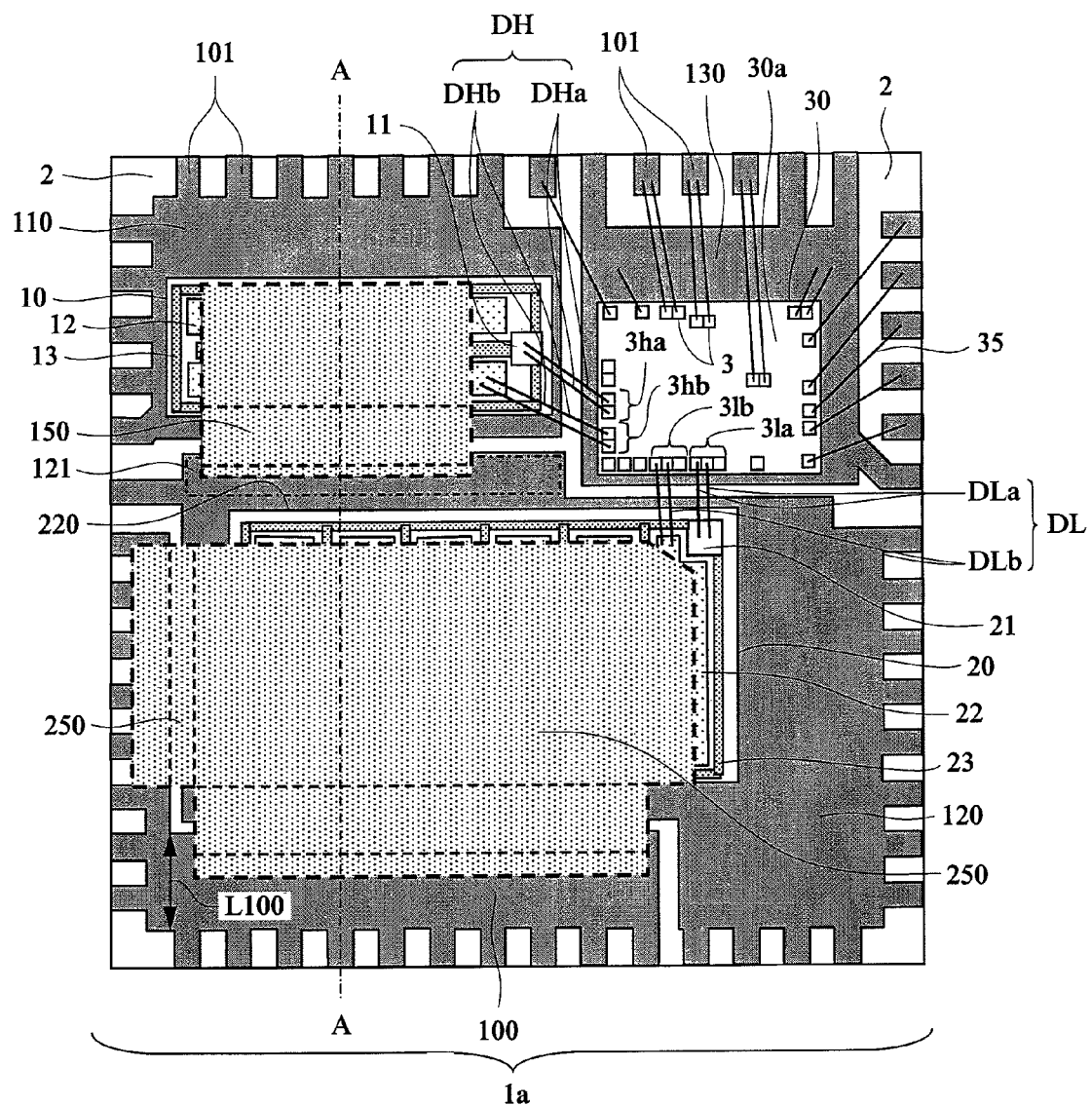
FIG. 10 is a plan view showing a multi-chip module in the case of replacing a part of a wire connection by a plate conductive member in the Embodiment 1 of the present invention, through the sealing material.
Figure 11:
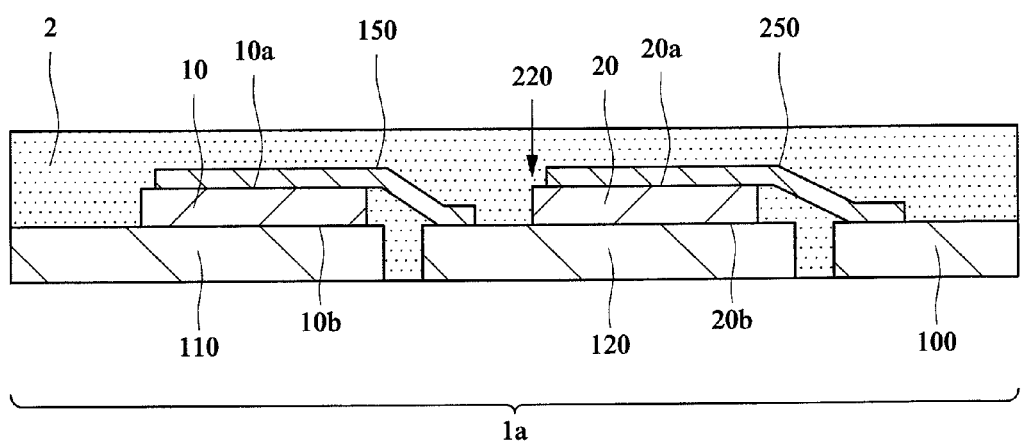
FIG. 11 is a cross sectional view showing a structure of the multi-chip module cut along the line A-A in FIG. 10.

FIGS. 10 and 11 show an MCM 1a corresponding to a modified example of the MCM 1 according to the present embodiment 1. FIG. 10 is a plan view showing a sealing material in the case of replacing a part of a wire connection of the MCM 1a by a plate conduction member in a transmission manner, and FIG. 11 is a cross sectional view showing a structure of a cross section of the MCM 1a cut along the line A-A in FIG. 10.

A different point between the MCM 1a shown in FIG. 10 and the MCM 1 shown in FIG. 1 exists in a point that the connection portions of the wires 15 and 25 in the MCM 1 in FIG. 1 are respectively replaced by plate conduction members 150 and 250. FIG. 11 shows the structure of the cross section of the MCM 1a cut along the line A-A in FIG. 10. In this case, as the plate conduction members 150 and 250, for example, copper or aluminum can be used.

Since the wire is replaced by the plate conduction member, it is possible to reduce a resistance of the plate conduction members 150 and 250 while having the feature of the MCM 1. Accordingly, it is possible to lower the loss of the power supply.

Figure 12:
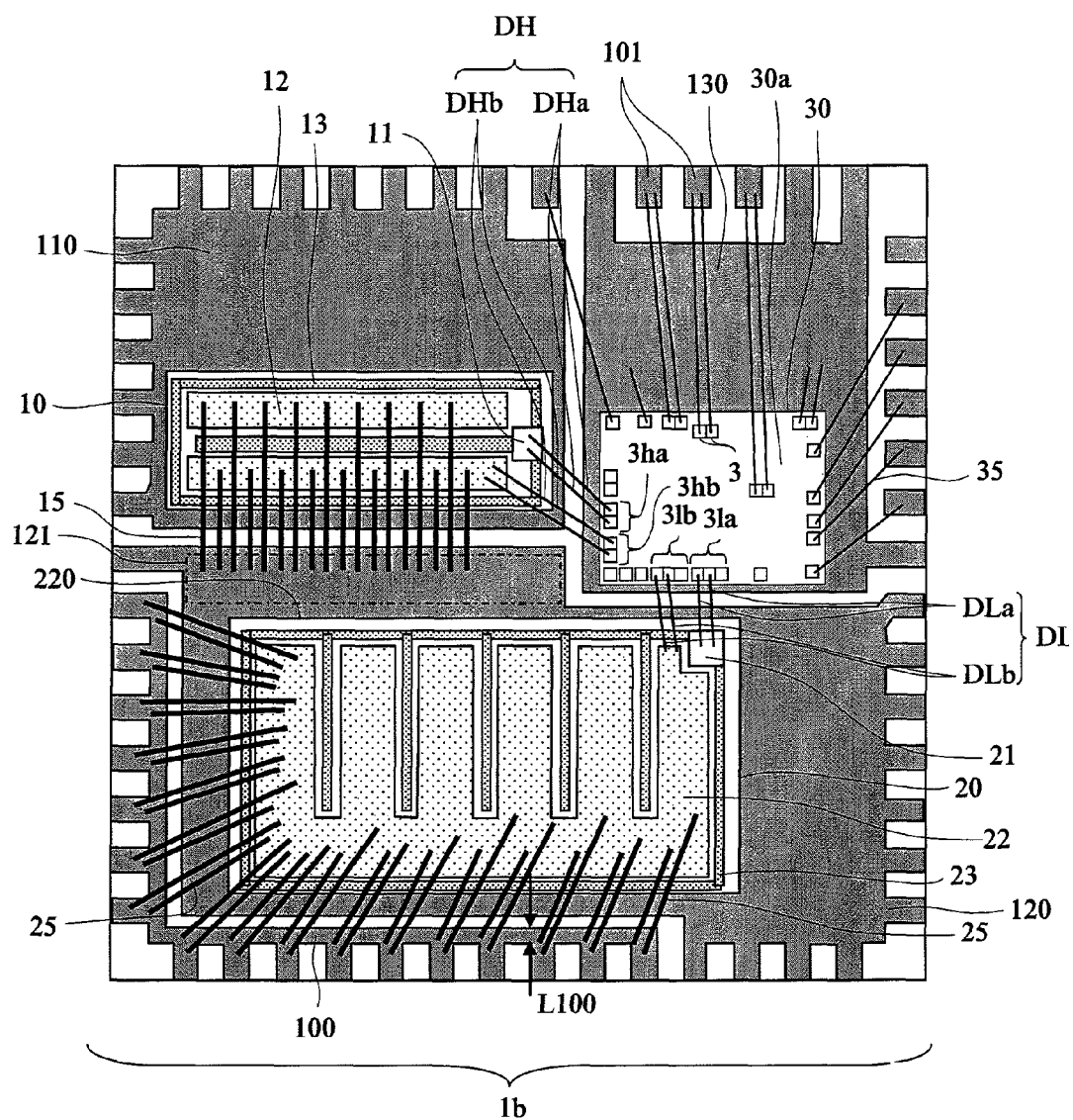
FIG. 12 is a plan view showing a multi-chip module in the case that the low-side power MOSFET is installed close to an external connection terminal side of a ground side plate lead portion in the Embodiment 1 according to the present invention, through the sealing material.

FIG. 12 shows an MCM 1b corresponding to a modified example of the MCM 1 according to the present embodiment 1. FIG. 12 is a plan view showing a case that the low-side power MOSFET of the MCM 1 is installed close to the external portion connection terminal side of the ground side plate lead portion with the sealing material 2 made transparent.

A different point between the MCM 1b shown in FIG. 12 and the MCM 1 shown in FIG. 1 exists in a point that the driver IC chip 30 and the high-side power MOSFET chip 10 are located close to the low-side power MOSFET chip 20 in the MCM 1b in place of locating the low-side power MOSFET chip 20 close to the driver IC chip 30 in the MCM 1.

In other words, the MCM 1b is different from the MCM 1 in the point that the length L100 in the direction of the low-side power MOSFET chip 20 of the ground side plate lead portion 100 is not elongated. Since the wire 25 does not become longer even in the aspect mentioned above, the switching loss is not increased, and it is possible to obtain all the effects mentioned in the description of the MCM 1.

In this case, the wiring length of the wire 35 becomes longer in comparison with the MCM 1, by employing the aspect mentioned above. However, since the parasitic inductance of the wire 35 does not affect very much the loss of the power supply, no problem is posed.

Embodiment 2

Figure 13:
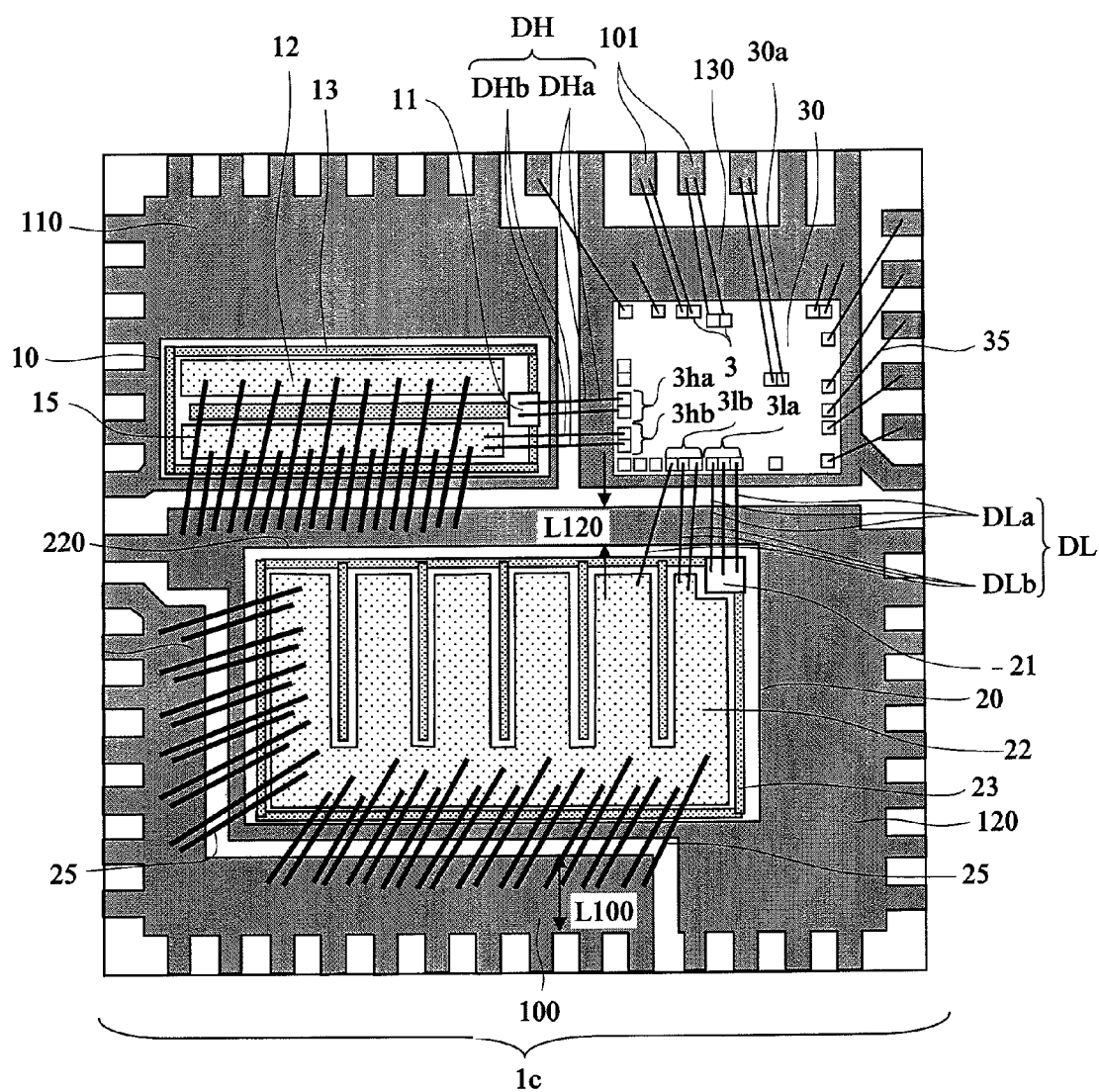
FIG. 13 is a plan view showing a multi-chip module according to an Embodiment 2 of the present invention through a sealing material.

FIG. 13 is a plan view showing an MCM 1c according to an embodiment 2 of the present invention with the sealing material on the front surface made transparent. In FIG. 13, a description of the same reference numerals as those of FIG. 1 is omitted.

A different point between the MCM 1c shown in FIG. 13 and the MCM 1 shown in FIG. 1 exists in a point that the convex region 121 in FIG. 1 is not provided within the output side plate lead portion 100, and the number of the wiring DL is larger than the number of the wiring DH (the number of the wiring DLa is three, the number of the wiring DLb is three, the number of the wiring DHa is two, and the number of the wiring DHb is two).

In the MCM 1c according to the present embodiment 2, since the convex region 121 shown in FIG. 1 is not provided, it is possible to make good use of the existing lead frame, however, since it is affected by the connection region between the source terminal 12 of the high-side power MOSFET chip 10 and the output side plate lead portion 120, the L120 becomes longer in comparison with the MCM 1. However, since each of the numbers of the wiring DLa and DLb is increased from two to three in the MCM 1c, it is possible to reduce the combined parasitic inductance of the wirings DLa and DLb.

In other words, in the present embodiment 2, since the parasitic inductance of the wiring DL is reduced by making the number of the wiring DL larger than the number of the wiring DH, it is possible to obtain the same effect as the MCM 1 while making good use of the existing lead frame.

In this case, each of the numbers of the wirings DLa and DLb is increased in the MCM 1c, however, it is possible to increase only the number of the wiring DLa or the wiring DLb. In this case, it is possible to obtain about one half of inductance reducing effect of the case where both of the wirings are increased.

Embodiment 3

Figure 14:
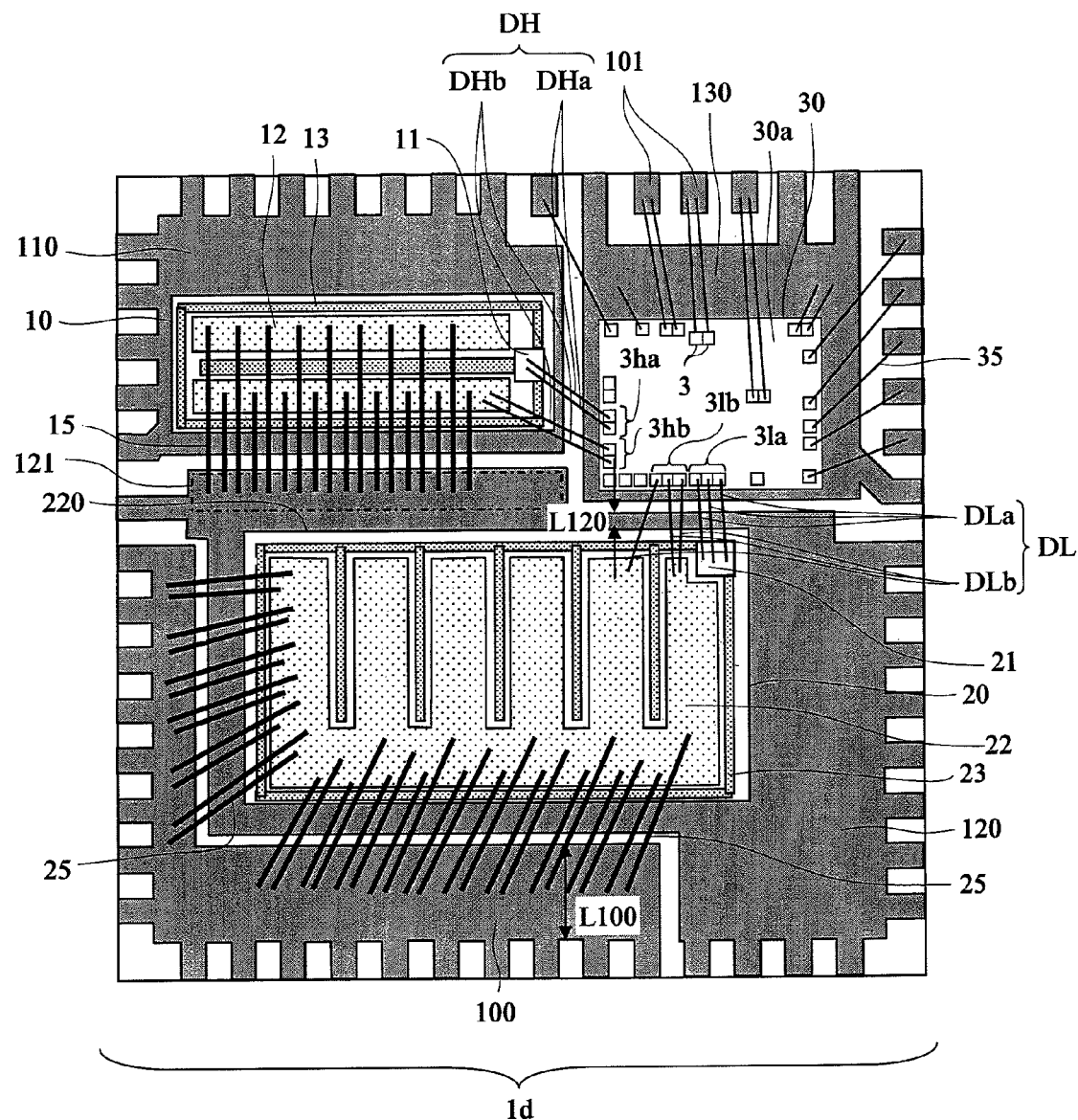
FIG. 14 is a plan view showing a multi-chip module according to an Embodiment 3 of the present invention through a sealing material.

FIG. 14 is a plan view showing an MCM 1d according to an embodiment 3 of the present invention in such a manner with a sealing material on the front surface viewed transparent. In FIG. 14, a description of the same reference numerals as those of FIG. 1 is omitted.

A different point between the MCM 1d shown in FIG. 14 and the MCM 1 shown in FIG. 1 exists in a point that the number of the wiring DL is larger than the number of the wiring DH (the number of the wiring DLa is three, the number of the wiring DLb is three, the number of the wiring DHa is two, and the number of the wiring DLb is two). Since the convex region 121 is provided, the wiring DL is short. Further, since the numbers of the wirings DLa and DLb are increased from two to three, it is possible to reduce the combined parasitic inductance of the wirings DLa and DLb to about two thirds of the combined parasitic inductance of the wirings DLa and DLb of the MCM 1.

In this case, the description is given where the effect obtained by increasing the number of the wiring DL in the embodiment 2, however, in the case of increasing the number of the wiring DL, it is necessary to increase an area of the gate terminal 21 or the source terminal 22 of the low-side power MOSFET chip 20.

However, if the area of the terminal pad is increased too much, there is a possibility that an effective area of the low-side power MOSFET chip 20 is reduced and the resistance is increased. Further, if the resistance of the low-side power MOSFET chip 20 is increased, the loss is increased, thereby the increase of the wiring number has a limit.

In the present embodiment 3, since it is possible to reduce the parasitic inductance of the wiring DL in comparison with the embodiments 1 or 2, by making the wiring length of the wiring DL short and increasing the number of the wiring DL, it is possible to increase the suppressing effect of the self turn-on, and it is possible to lower the loss of the large current and high frequency power supply.

Embodiment 4

Figure 15:
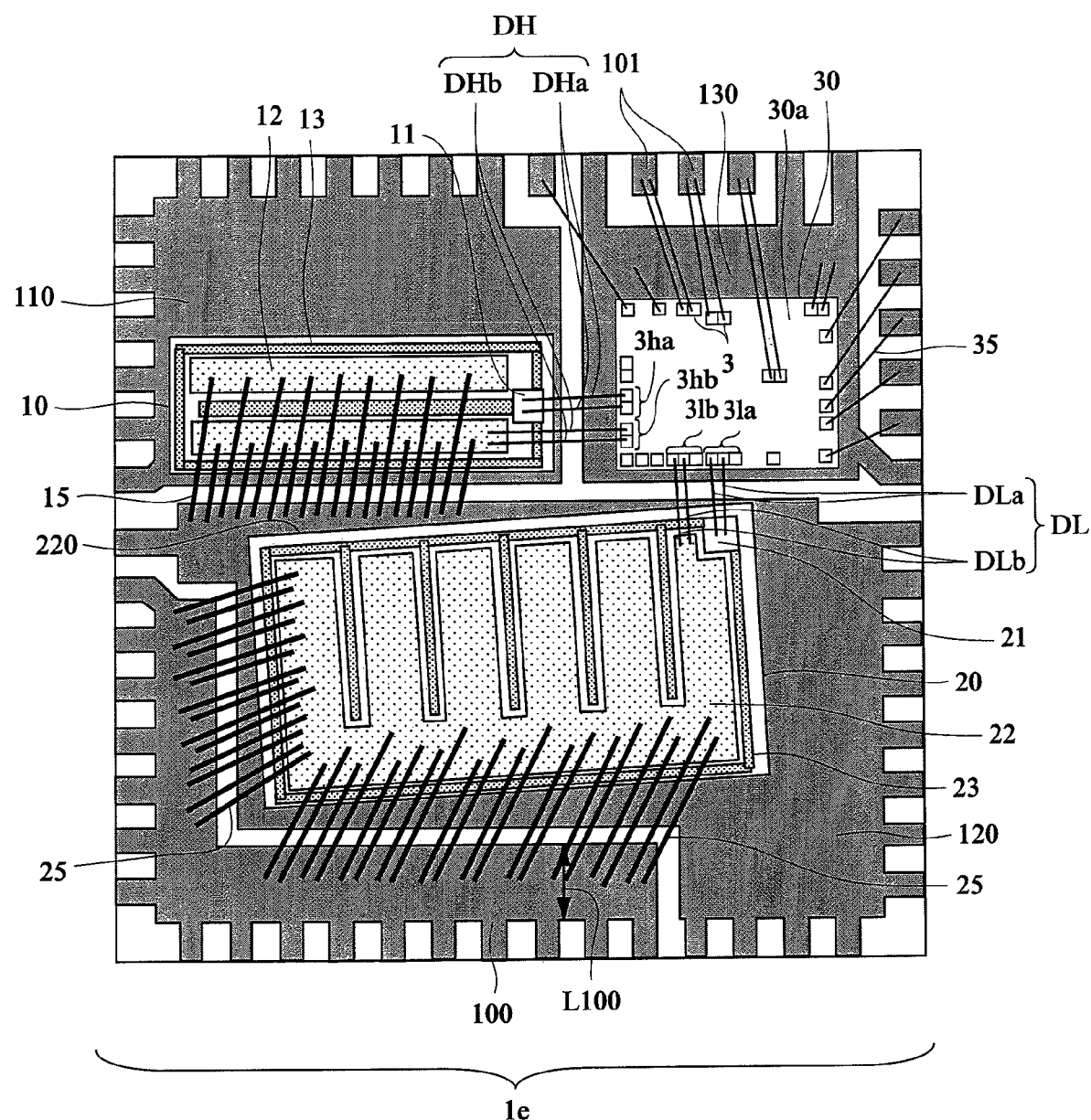
FIG. 15 is a plan view showing a multi-chip module according to an Embodiment 4 of the present invention through a sealing material.

FIG. 15 is a plan view showing an MCM 1e according to an embodiment 4 of the present invention in such a manner with a sealing material on a front surface viewed transparent. In FIG. 15, a description of the same reference numerals as those of FIG. 1 will be omitted.

A description will be given about a different point between the MCM 1e shown in FIG. 15 and the MCM 1 shown in FIG. 1.

A first different point exists in a point that the low-side power MOSFET chip 20 does not have the side surface facing the high-side power MOSFET chip 10 and the driver IC chip 30, and the high-side power MOSFET chip 10 and the driver IC chip 30 are arranged in such a manner so as to have a side surface directed to the low-side power MOSFET chip 20 side.

A second different point exists in a point that the convex region 121 shown in FIG. 1 is not provided, and the low-side power MOSFET chip 20 is arranged on the output side plate lead portion so as to be sloped to the line facing the high-side power MOSFET chip 10 in such a manner that a shortest distance between the low-side power MOSFET chip 20 and the driver IC chip 30 becomes shorter than a shortest distance between the high-side power MOSFET chip 10 and the driver IC chip 30.

In the MCM 1e according to the present embodiment 4, since the convex region 121 shown in FIG. 1 is not provided, it is possible to make good use of the existing lead frame.

Further, since the low-side power MOSFET chip 20 is arranged so as to be sloped to the line of the output side plate lead portion facing the high-side power MOSFET chip 10, it is possible to make the shortest distance between the low-side power MOSFET chip 20 and the driver IC chip 30 shorter than the shortest distance between the high-side power MOSFET chip 10 and the driver IC chip 30 while securing the connection region between the source terminal 12 of the high-side power MOSFET chip 10 and the output side plate lead portion 120.

Further, since the shortest distance between the low-side power MOSFET chip 20 and the driver IC chip 30 is made shorter than the shortest distance between the high-side power MOSFET chip 10 and the driver IC chip 30, it is possible to make the wiring length of the wiring DL shorter than the wiring length of the wiring DH.

In other words, according to the present embodiment 4, since the parasitic inductance of the wiring DL is reduced by arranging the low-side power MOSFET chip 20 on the output side plate lead portion so as to be sloped to the line facing the high-side power MOSFET chip 10, it is possible to obtain the same effect as that of the MCM 1 while making good use of the existing lead frame.

In this case, in the present embodiment 4, the high-side power MOSFET chip 10 is arranged in "on the left end as one faces the drawing" of the input side plate lead portion 110 in such a manner that the sloped low-side power MOSFET chip 20 comes as close as possible to the driver IC chip 30, without reducing the number of the wire 15. Accordingly, there is a possibility that the wiring DH of the high-side power MOSFET chip 20 becomes longer.

However, since the parasitic inductance of the wiring DH does not affect the loss very much as mentioned above, no problem is generated.

Embodiment 5

Figure 16:
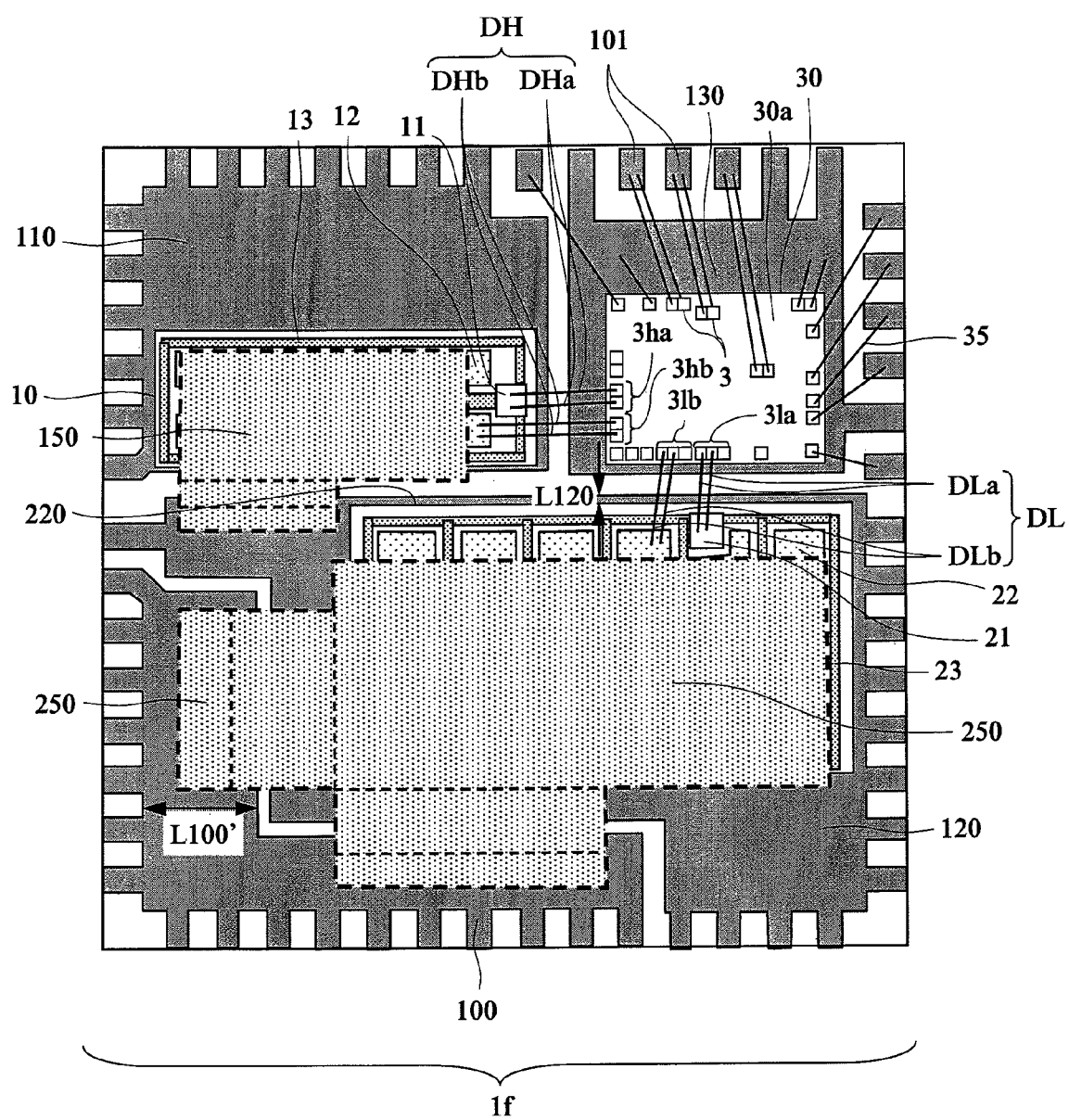
FIG. 16 is a plan view showing a multi-chip module according to an Embodiment 5 of the present invention through a sealing material.

FIG. 16 is a plan view showing an MCM 1f according to an embodiment 5 of the present invention with a sealing material on a front surface viewed transparent. In FIG. 16, a description of the same reference numerals as those of FIG. 1 will be omitted.

A description will be given about a different point between the MCM 1f shown in FIG. 16 and the MCM 1 shown in FIG. 1.

A first different point exists in a point that a region (a fourth region) electrically connecting between the source terminal 12 of the high-side power MOSFET chip 10 and the output side plate lead portion 120 is provided in a region on the output side plate lead portion 120 facing the high-side power MOSFET chip 10, and close to the short line of the low-side power MOSFET chip 20, in place of the no convex region 121 provided.

A second different point exists in a point that a length L100' in the direction of the low-side power MOSFET chip 20 of the ground side plate lead portion 100 is set longer than the length L120 in the direction of the driver IC chip 30 of the region (the second facing region) facing the driver IC 30 of the output side plate lead portion 120 (L100' is elongated).

A third different point exists in a point that the connection portions by the wires 15 and 25 in the MCM 1 are respectively replaced by the plate conductive members 150 and 250.

In other words, the low-side power MOSFET chip 20 is arranged in "on the right end as one faces the drawing" of the output side plate lead portion 120, the source terminal 12 of the high-side power MOSFET chip 10 and the output side plate lead portion 120 are connected by the plate conductive member 150 by utilizing the region formed in "on the left side as one faces the drawing" of the low-side power MOSFET chip 20, the ground side plate lead portion 100 and the source terminal 21 of the low-side power MOSFET chip 20 are connected by the plate conductive member 250, and the ground side plate lead portion 100 is expanded to the low-side power MOSFET chip 20 side (L100' is elongated).

In the present embodiment 5, the connection region between the output side plate lead portion 120 and the plate conductive member 150 becomes narrower in comparison with the case that the convex region 121 is provided, however, since the plate conductive member 150 is used in place of the wire 15, the wiring resistance can be made small in spite of the wiring inductance being slightly increased in comparison with the case of FIG. 1.

Embodiment 6

Figure 17:
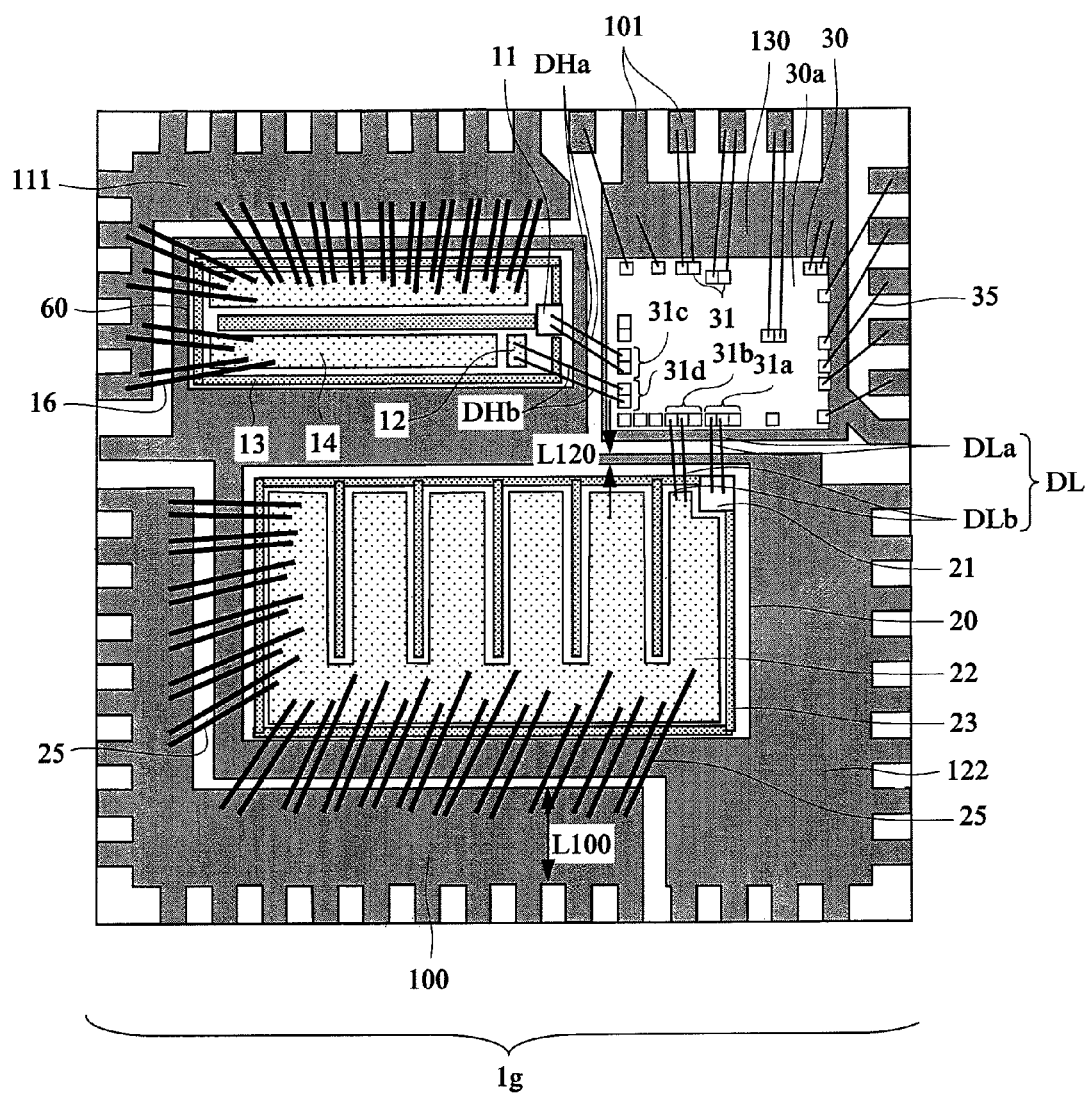
FIG. 17 is a plan view showing a multi-chip module according to an Embodiment 6 of the present invention through a sealing material.

FIG. 17 is a plan view showing an MCM 1g according to an embodiment 6 of the present invention with a sealing material on a front surface viewed transparent. A description of the same reference numerals as those of FIG. 1 will be omitted.

A description will be given about a different point between the MCM 1g shown in FIG. 17 and the MCM 1 shown in FIG. 1.

A first different point exists in a matter that an n-channel type lateral field effect transistor is used in a high-side power MOSFET chip 60. A schematic cross sectional view showing a unit cell structure is shown in FIGS. 18A and 18B.

Figure 18A:
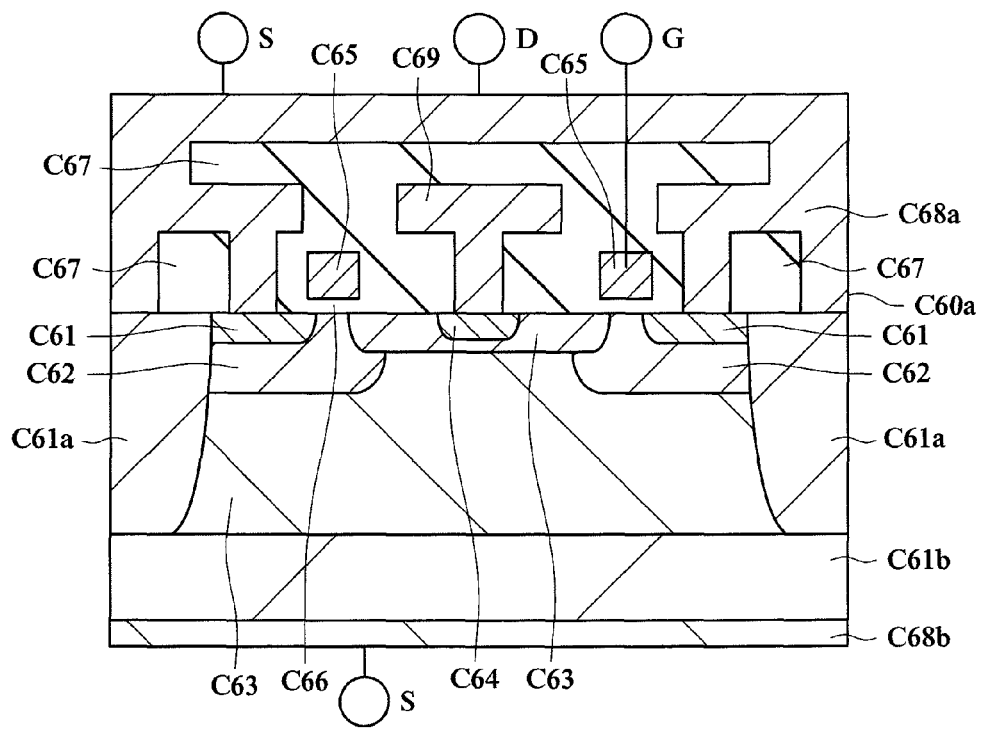
FIG. 18A is a schematic cross sectional view showing a unit cell structure of an n-channel type lateral field-effect transistor used in a high-side power MOSFET in the Embodiment 6 of the present invention.
Figure 18B:
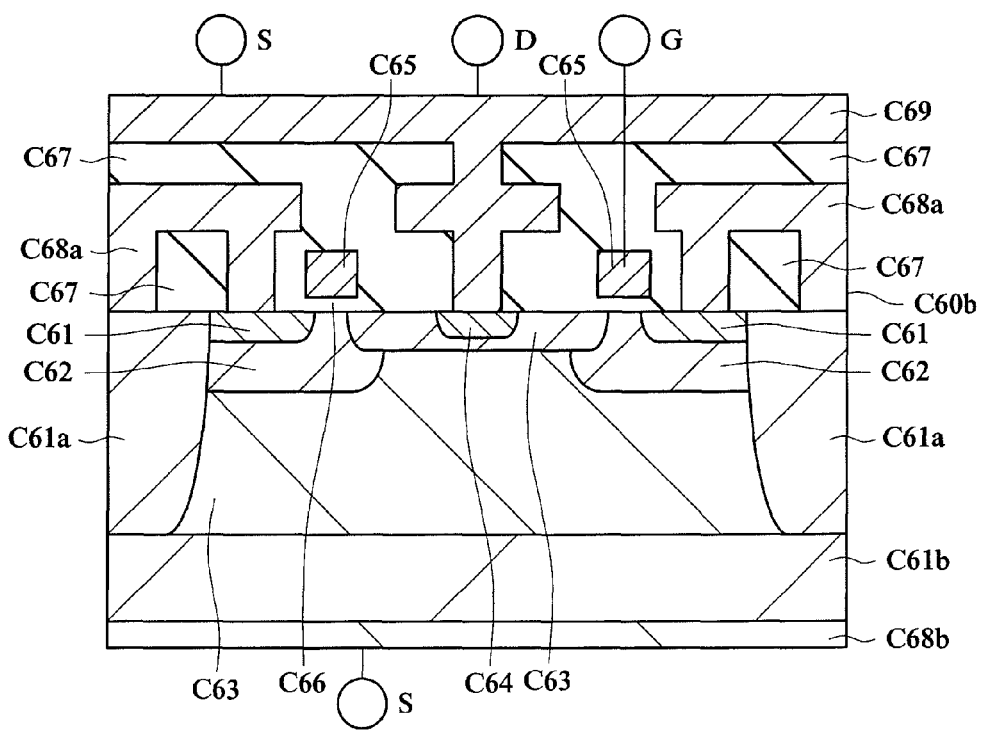
FIG. 18B is a schematic cross sectional view showing a unit cell structure of the n-channel type lateral field-effect transistor used in the high-side power MOSFET in the Embodiment 6 of the present invention.

FIG. 18A shows a unit cell C60a of the transistor existing in the region of the source terminal 12, and FIG. 18B shows a unit cell C60b of the transistor existing in the region of the drain terminal 14. In FIGS. 18A and 18B, reference symbols C60a and C60b denote a unit cell, reference symbols C61, C61a and C61b denote an $n^+$ type semiconductor region, reference symbol C62 denotes a p type semiconductor region, reference symbol C63 denotes an $n^-$ type semiconductor region, reference symbol C64 denotes an $n^+$ type semiconductor region, reference symbol C65 denotes an $n^+$ polycrystalline semiconductor region forming a gate electrode, reference symbol C66 denotes a gate oxide film, reference symbol C67 denotes an insulating film, reference symbols C68a and C68b denote a metal thin film (for example, an aluminum thin film) forming a source electrode, and reference symbol C69 denotes a metal thin film forming a drain electrode.

A width of the unit cells C60a and C60b is about 1 to 2 micro meters, and the transistor portion of the high-side power MOSFET chip 10 is formed by arranging some thousands of unit cells. For example, a set of C68a forms the source terminal 12, and a set of C69 forms the drain terminal 14. In the drawing, to facilitate understanding of the electrode structure of the unit cell, there is shown a state in which the terminal line is drawn out from the region forming the electrode, respectively shown schematically such as S (source), G (gate) and D (drain).

In the unit cells C60a and C60b, the current flows in a lateral direction from the drain electrode (C64) to the source (C61), and flows to another source (C61b) via C61a.

A second different point exists in a point that both of the high-side power MOSFET chip 60 and the low-side power MOSFET chip 20 are mounted on the output side plate lead portion 122.

In the case of the n-channel type lateral field effect transistor shown in FIGS. 18A and 18B, since the source terminal 12 exists on the front surface and the back surface of the chip, it is possible to connect the wiring DHb of the high-side MOSFET chip 60 in the front surface side of the chip 60 in the same manner as shown in FIG. 1, and it is possible to commonly use the plate lead portion mounting the high-side MOSFET chip 60 thereon with the output side plate lead portion mounting the low-side power MOSFET chip 20. In this case, the drain terminal 14 and the input side plate lead portion 111 are connected by the wire 16.

In the present embodiment 6, it is possible to arrange the low-side power MOSFET chip 20 close to the driver IC chip 30 without being limited by the connection region between the source terminal of the high-side power MOSFET chip 60 and the output side plate lead portion 122, by mounting the high-side power MOSFET chip 60 on the output side plate lead portion.

In this case, since the lateral type field effect transistor is used in the high-side power MOSFET chip 60 in the present embodiment 6, the on resistance of the high-side power MOSFET chip 60 becomes higher in comparison with the embodiments 1 to 5, however, since the on-state time (the time for which the voltage is applied) of the high-side power MOSFET chip 60 is shorter than the on-state time of the low-side power MOSFET chip 20, and the conduction loss due to the on resistance is smaller than the switching loss, as mentioned above, a great problem is not posed.

Embodiment 7

Figure 19:
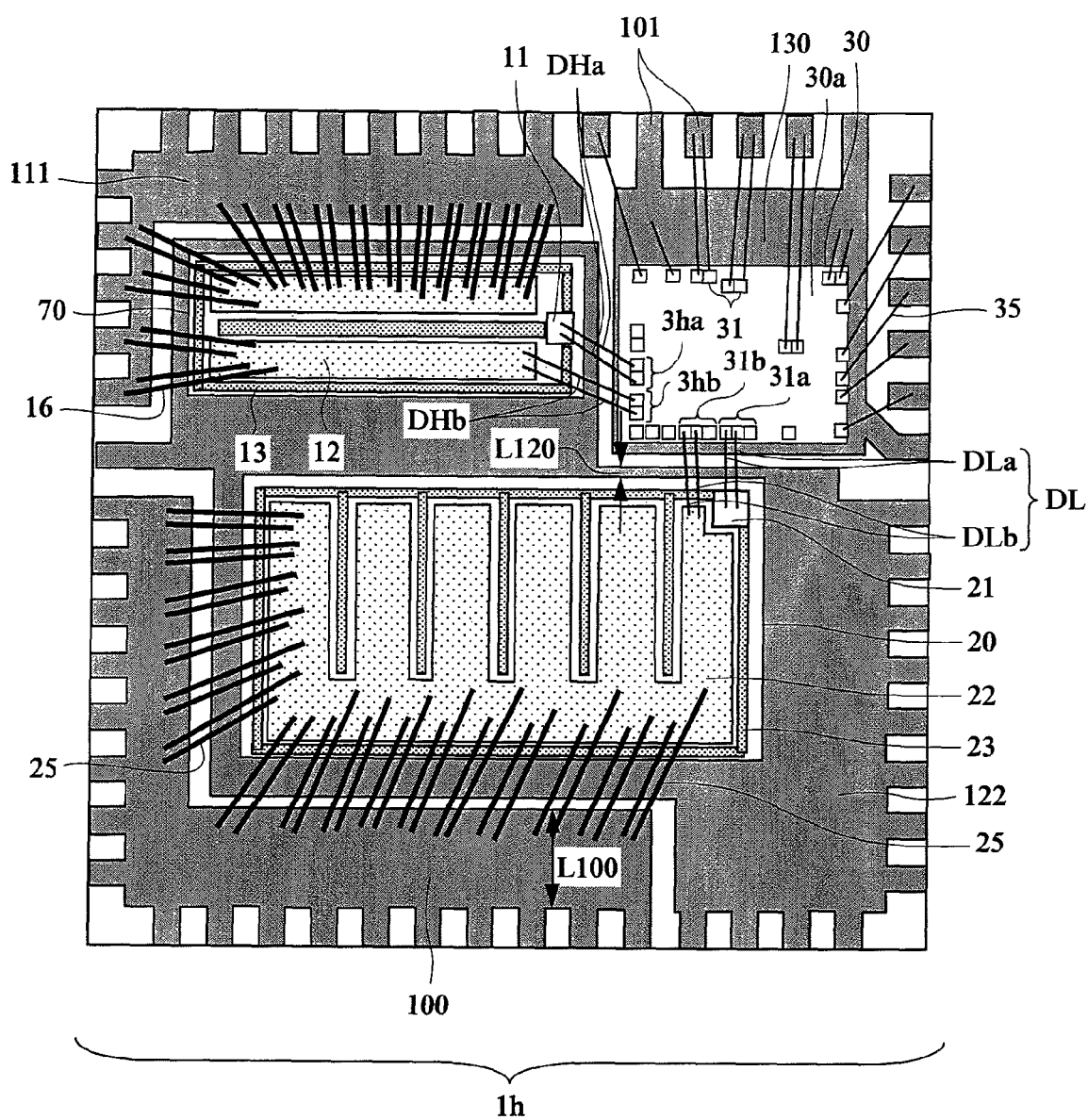
FIG. 19 is a plan view showing a multi-chip module according to an Embodiment 7 of the present invention through a sealing material.

FIG. 19 is a plan view showing an MCM 1h according to an embodiment 7 of the present invention with a sealing material on a front surface viewed transparent. In FIG. 19, a description of the same reference numerals as those of FIG. 1 is omitted.

A description will be given about a different point between the MCM 1h shown in FIG. 19 and the MCM 1 shown in FIG. 1.

Figure 20:
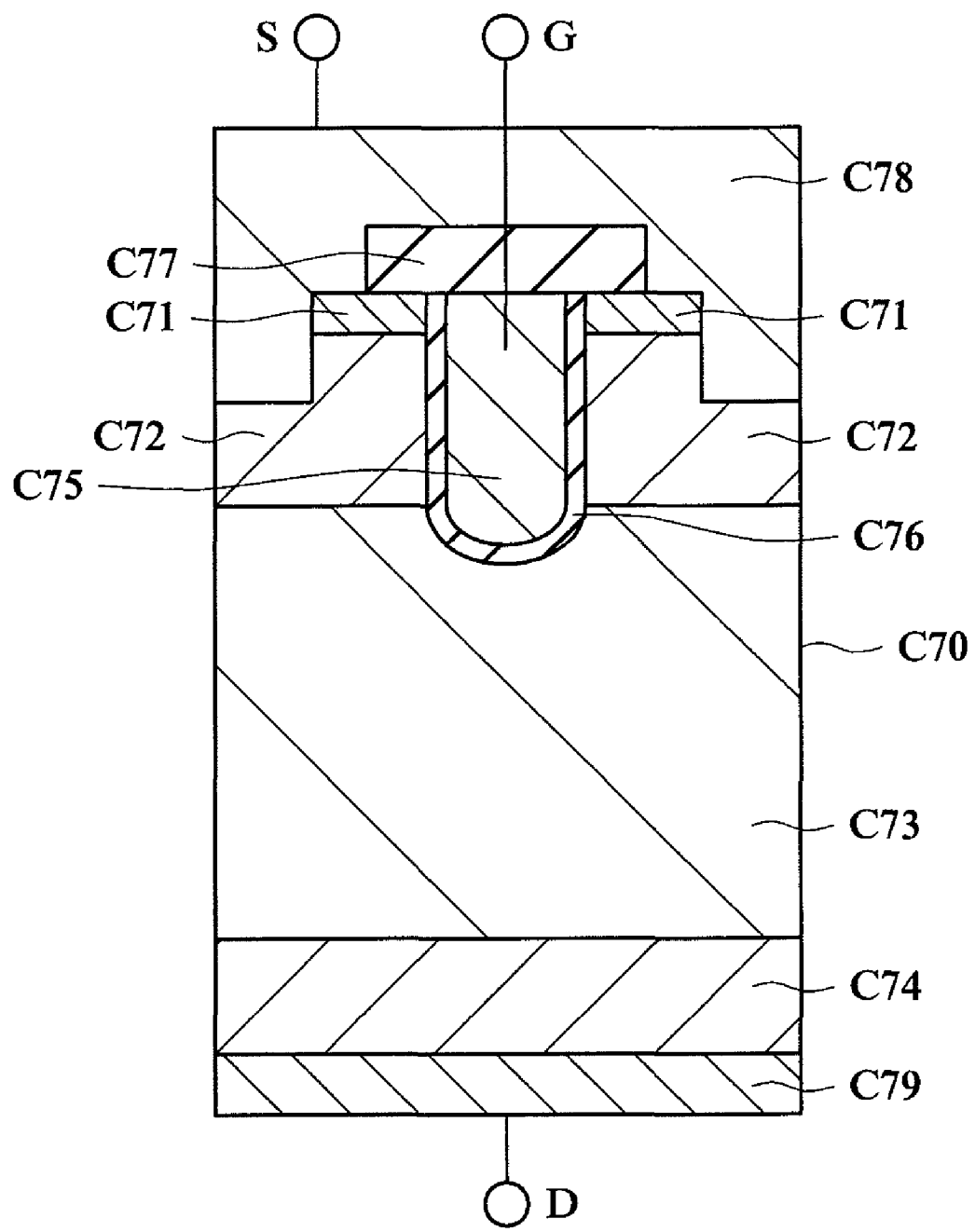
FIG. 20 is a schematic cross sectional view showing a unit cell structure of a p-channel type vertical field effect transistor used in a high-side power MOSFET in the Embodiment 7 according to the present invention.

A first different point exists in a matter that the p-channel type vertical field effect transistor is used in a high-side power MOSFET chip 70, and a schematic cross sectional view showing a unit cell structure thereof is shown in FIG. 20.

In FIG. 20, reference symbol C70 denotes a unit cell, reference symbol C71 denotes a $p^+$ type semiconductor region, reference symbol C72 denotes an n type semiconductor region, reference symbol C73 denotes a $p^-$ type semiconductor region, reference symbol C74 denotes a $p^+$type semiconductor region, reference symbol C75 denotes an $n^+$ polycrystalline semiconductor region forming a gate electrode, reference symbol C76 denotes a gate oxide film, reference symbol C77 denotes an insulating film, reference symbol C78 denotes a metal thin film (for example, an aluminum thin film) forming a source electrode, and reference symbol C79 denotes a metal thin film forming a drain electrode.

A width of the unit cell C70 is about 1 to 2 micro meters, and the transistor portion of the high-side power MOSFET chip 70 is formed by arranging some thousands of unit cells. For example, a set of C78 forms the source terminal 12. In the drawing, to facilitate understanding of the electrode structure of the unit cell, there is schematically shown a state in which the terminal line is drawn out from the region forming the electrode, respectively such as S (source), G (gate) and D (drain).

In the unit cell C70, the current flows in a vertical direction from the source electrode side (C78 side) to the drain electrode side (C79 side).

A second different point exists in a point that both of the high-side power MOSFET chip 70 and the low-side power MOSFET chip 20 are mounted on the output side plate lead portion 122.

In the case of the p-channel type vertical field effect transistor, since the drain terminal (not shown) existing on the back surface of the chip is connected to the output side plate lead portion, it is possible to commonly use the plate lead portion mounting the high-side MOSFET chip 70 thereon with the output side plate lead portion mounting the low-side power MOSFET chip 20 thereon.

In the present embodiment 7, it is possible to arrange the low-side power MOSFET chip 20 close to the driver IC chip 30 without being limited by the connection region between the source terminal of the high-side power MOSFET chip 70 and the output side plate lead portion 122 by mounting the high-side power MOSFET chip 70 on the output side plate lead portion.

In this case, since the p-channel type field effect transistor is used in the high-side power MOSFET chip 70 also in the present embodiment 7, the on resistance of the high-side power MOSFET chip 70 becomes higher in comparison with the embodiments 1 to 5, however, since the on-state time (the time for which the voltage is applied) of the high-side power MOSFET chip 70 is shorter than the on-state time of the low-side power MOSFET chip 20, and the conduction loss due to the on resistance is smaller than the switching loss, as mentioned above, a great problem is not posed.

Embodiment 8

The driver IC chip 30 mounted on the MCM 1 to MCM 1h described in the embodiments 1 to 7 of the present invention is constituted by a p-channel type power MOSFET and an n-channel power MOSFET (two power MOSFETs forming an inverter) in an output stage driving the gate of the high-side power MOSFET chip 10, and a p-channel type power MOSFET and an n-channel type power MOSFET in an output stage driving the gate of the low-side power MOSFET chip 20 and the like.

In this case, a description will be given about the on resistance of the driver IC chip 30. The on resistance of the driver IC chip 30 corresponds to the on resistance of the power MOSFET in the output stage. Further, the on resistance of the power MOSFET in the output stage is constituted by a resistance of a device itself formed within a silicon substrate and a wiring resistance of a wiring layer connecting the drain and the source portion within the silicon substrate to the output terminal of the driver IC.

In the present embodiment 8, there is provided a technique which can lower the loss of the large current and high frequency power supply by replacing the driver IC chip 30 mounted on the MCM 1 to MCM 1h described in the embodiments 1 to 7 to the driver IC chip 30 having the lower on resistance.

Figure 21B:
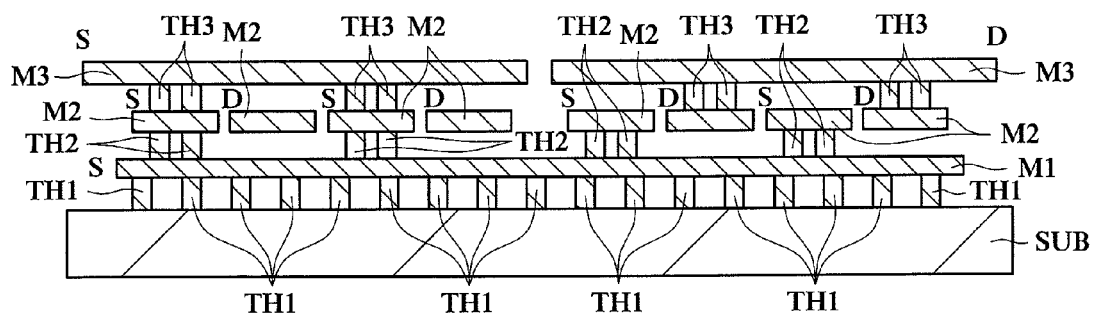
FIG. 21B is a schematic cross sectional view of the output stage n-channel type power MOSFET of the driver IC chip 30 mounted to the multi-chip module according to the Embodiment 8 of the present invention cut along the line S-S' shown in FIG. 21A.
Figure 21C:
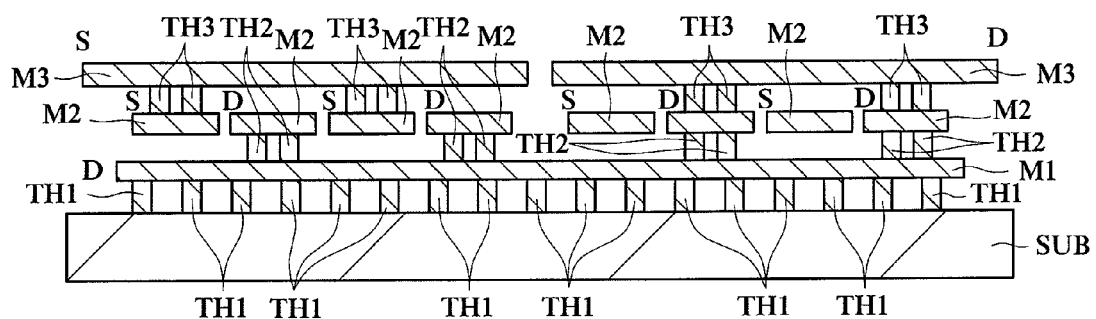
FIG. 21C is a schematic cross sectional view of the output stage n-channel type power MOSFET of the driver IC chip 30 mounted to the multi-chip module according to the Embodiment 8 of the present invention cut along the line D-D' shown in FIG. 21A.

FIG. 21A is a schematic plan view of the output stage n-channel type power MOSFET of the driver IC chip 30 mounted on the MCM according to the embodiment 8 of the present invention as viewed from an upper surface, FIG. 21B is a schematic cross sectional view thereof cut along the line S-S' shown in FIG. 21A, and FIG. 21C is a schematic cross sectional view thereof cut along the line D-D' shown in FIG. 21A.

The output stage n-channel type power MOSFET of the driver IC chip 30 used in the present embodiment 8 is constituted by a substrate SUB, for example, a silicon substrate, a first layer of metal wiring M1 formed on the substrate SUB, a second layer of metal wiring M2, a third layer of metal wiring M3, a through hole TH1 connecting the substrate SUB and the metal wiring M1, a through hole TH2 connecting the metal wiring M1 and the metal wiring M2, and a through hole TH3 connecting the metal wiring M2 and the metal wiring M3, as shown in FIGS. 21A, 21B and 21C.

A source wiring S is constituted by the metal wirings M1, M2 and M3, and the through holes TH1, TH2 and TH3, and is connected to the source portion of the substrate SUB. Further, a drain wiring D is constituted by the metal wirings M1, M2 and M3, and the through holes TH1, TH2 and TH3, and is connected to the drain portion of the substrate SUB.

In this case, in FIGS. 21B and 21C, to facilitate understanding of the connection relation among the metal wirings M1, M2 and M3, the through holes TH1, TH2 and TH3 are shown so as to be arranged in a line on the S-S' cross section and the D-D' cross section, however, they are actually arranged as shown in FIG. 21A. For example, in FIG. 21B, when TH2 exists on the S-S' cross section, TH3 is arranged on a far side with respect to the paper surface, and TH1 is arranged in a near side with respect to the paper surface.

Figure 22:
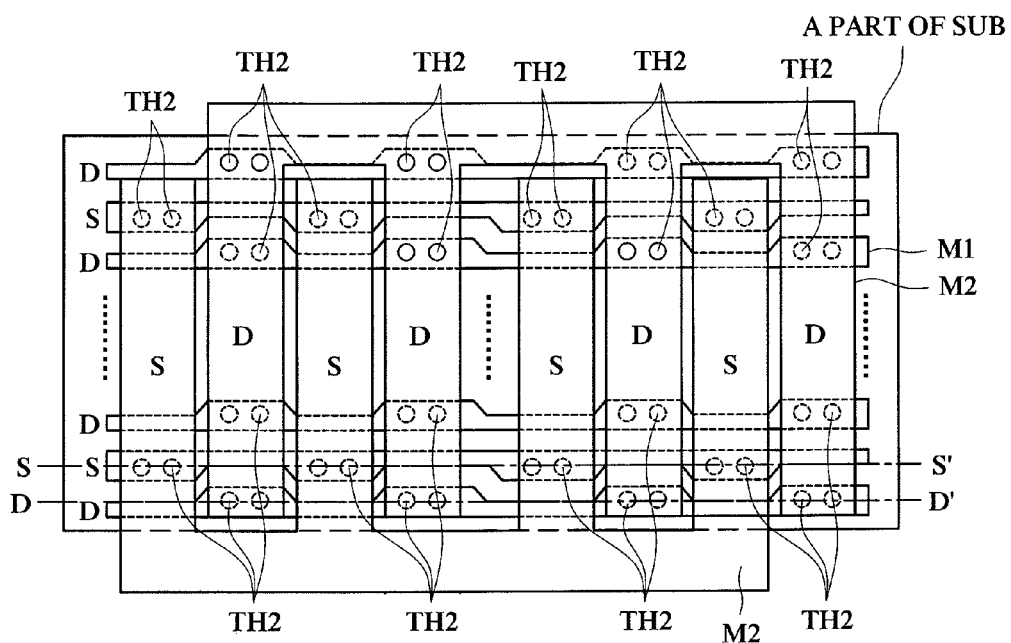
FIG. 22 is a schematic plan view showing the output stage n-channel type power MOSFET shown in FIG. 21A to FIG. 21D by removing a metal wiring M3 and a metal wiring through hole TH3.

FIG. 22 is a schematic plan view showing the output stage n-channel type power MOSFET shown in FIG. 21A by removing the metal wiring M3 and the through hole TH3 for the metal wiring therein, and FIG. 23 is a schematic plan view showing the connection state between the output stage n-channel type power MOSFET chip driving the gate of the low-side power MOSFET chip 20 and the output terminal 31b of the driver IC chip 30. In FIGS. 22 to 23, a description of the same reference numerals as those of FIG. 21 will be omitted.

In FIG. 22, the second layer of metal wirings M2 correspond to parts of the source wiring S and the drain wiring D are formed in a comb shape, and are arranged so as to face each other.

In FIG. 23, the n-channel type power MOSFET driving the gate of the low-side power MOSFET chip 20 is structured such that the third layer of metal wiring M3 is connected to the output terminal 31b of the driver IC chip 30.

In this case, although an illustration is omitted, the drain side metal wiring M3 of the output stage n-channel type power MOSFET driving the gate of the low-side power MOSFET chip 20 is connected to the drain side metal wiring M3 of the output stage p-channel type power MOSFET driving the gate of the low-side power MOSFET chip 20, and is connected to the output terminal 31a of the driver IC chip 30 by using the metal wiring M3.

In the same manner, although an illustration is omitted, the source side metal wiring M3 of the output stage n-channel type power MOSFET driving the gate of the high-side power MOSFET chip 10 is connected to the output terminal 3hb of the driver IC chip 30, and the drain side metal wiring M3 is connected to the drain side metal wiring M3 of the output stage p-channel type power MOSFET driving the gate of the high-side power MOSFET chip 10, and is connected to the output terminal 3ha of the driver IC chip 30 by using the metal wiring M3.

FIGS. 24A and 24B are cross sectional views showing a unit cell structure of the output stage n-channel type power MOSFET chip shown in FIG. 21A. FIG. 24A is a cross sectional view of the metal wiring M2 existing below the drain side (a D on the right side in the drawing) of the metal wiring M3 shown in FIG. 21A cut along the drain wiring D, and FIG. 24B is a cross sectional view of the metal wiring M2 existing below the source side (an S on the left side in the drawing) of the metal wiring M3 shown in FIG. 21A cut along the source wiring S. In FIGS. 24A and 24B, to facilitate understanding of the electrode structure of the unit cell, the terminal line is drawn out from the region forming the electrode, and is schematically shown such as S (source), G (gate) and D (drain). In FIGS. 24A and 24B, a description of the same reference numerals as those of FIG. 21 will be omitted.

In FIGS. 24A and 24B, reference symbols C80a and C80b denote a unit cell, reference symbol C81 denotes an $n^+$ type semiconductor region, reference symbol C82 denotes a p type semiconductor region, reference symbol C83 denotes an $n^-$ type semiconductor region, reference symbol C84 denotes an $n^+$ type semiconductor region, reference symbol C820 denotes a p type silicon substrate region, reference symbol C85 denotes an $n^+$ polycrystalline semiconductor region forming the gate electrode, reference symbol C86 denotes a gate oxide film, reference symbol C87 denotes an isolated film, reference symbol C88 denotes a metal thin film (for example, an aluminum thin film) forming the source electrode, and reference symbol C89 denotes a metal thin film forming the drain electrode. A width of the unit cells C80a and C80b is about some micro meters, and the output stage n-channel type power MOSFET is formed by arranging some tens of unit cells.

Comparing the MCM 1 through MCM 1h described in the embodiments 1 through 7 with the MCM according to the present embodiment 8, the structure of the wiring layer of the driver IC chip 30 is different. In other words, in the MCM 1 through MCM 1h described in the embodiments 1 through 7, the wiring layer of the driver IC chip 30 is formed as the two-layer structure, however, the MCM according to the present embodiment 8 is formed as a three-layer structure as shown in FIGS. 21 to 24. Further, a film thickness of the third layer of metal wiring M3 in which a fine pattern design rule is not required is set, for example, to 2 μm or more as shown in FIGS. 24A and 24B, and is made thicker than the first layer of metal wiring M1 and the second layer of metal wiring M2.

Since a logic circuit within the driver IC used in the power supply circuit has a small scale of logic, and is sufficiently actuated at a comparatively low operating frequency such as about some MHz, the fine pattern design is basically applied to the metal second layer wiring. Accordingly, when the wiring layer of the driver IC chip 30 is formed as the three-layer structure, it is possible to make the film thickness of the third layer of metal wiring M3 thicker than the first layer of metal wiring M1 and the second layer of metal wiring M2.

Further, since the film thickness of the third layer of metal wiring M3 can be made thicker than the first layer of metal wiring M1 and the second layer of metal wiring M2, it is possible to make the wiring resistance occupying about 40% of the on resistance equal to or less than one half of the case of the two-layer structure.

In this case, as the other method of reducing the wiring resistance, the wiring material can be changed from the aluminum thin film to the copper thin film.

In accordance with the present embodiment 8, since it is possible to reduce the inductance of the wiring DL and it is possible to reduce the on resistance of the driver IC chip 30, it is possible to obtain the combined effect mentioned above, and it is possible to lower the loss of the large current and high frequency power supply.

In this case, if the gate electrode resistance of the low-side power MOSFET chip 20 is made smaller, it is possible to obtain the same loss reduction effect as the reduction of the on resistance of the driver IC.

In order to make the gate electrode resistance small, an alloy structure (a polycide structure) of a metal material such as platinum, cobalt or the like and polycrystalline silicon may be employed in place of the polycrystalline semiconductor (polycrystalline silicon), or a metal material such as tungsten or the like may be used for the gate.

In this case, the polycide structure corresponds to a two-layer structure in which a silicide corresponding to a chemical compound between silicon and the metal element is formed on the polycrystalline silicon film. In order to form the gate electrode of the polycide structure, a metal thin film having a high melting point is formed on the polycrystalline silicon film, the silicide thin film is thereafter formed by heat treatment at about 800° C., the non-reacted part of the metal film is removed, and a heat treatment for stabilization is thereafter executed again so as to achieve a low resistance.

In the foregoing, the invention made by the inventors of the present invention has been concretely described based on the embodiments. However, it is needless to say that the present invention is not limited to the foregoing embodiments and various modifications and alterations can be made within the scope of the present invention.

For example, in FIGS. 15, 16, 17 and 19, there is shown the case that the number of the wiring DL is equal to the number of the wiring DH, however, it is of course possible to make the number of the wiring DL larger than the number of the wiring DH. In this case, it goes without saying that the self turn-on can be further suppressed.

Further, in FIGS. 13, 14, 15, 17 and 19, there is shown the case that the electrode terminal of the power MOSFET is connected to the plate lead portion by using the wires 15, 16 and 25, however, it is of course possible to use the metal plate, for example, made of copper or aluminum in place of the wire. In this case, it goes without saying that the wiring resistance is reduced and the power supply loss is reduced.

The present invention can be applied to a semiconductor device, particularly to a semiconductor device having a power supply circuit.

What is claimed is:

1. A semiconductor device comprising:
a high-side switching device;
a low-side switching device;
a driver IC controlling to turn on and off the high-side switching device and the low-side switching device;
an input side plate lead portion, to which an input side voltage is electrically applied, which is electrically connected to an electrode in a back surface side of the high-side switching device, and which mounts the high-side switching device thereon;
an output side plate lead portion, to which an output side voltage is electrically applied, which is electrically connected to an electrode in a back surface side of the low-side switching device, and which mounts the low-side switching device thereon;
a driver side plate lead portion, which mounts the driver IC thereon; and
a ground side plate lead portion, to which a ground side voltage is electrically applied, and
the high-side switching device, the low-side switching device, the driver IC, the input side plate lead portion, the output side plate lead portion, the driver side plate lead portion, and the ground side plate lead portion being stored in one package, wherein
a gate terminal of the low-side switching device is provided in a first line side facing one side of a plane of the driver IC among sides of a plane of the low-side switching device,
in the output side plate lead portion, a third facing region where a first facing region facing the high-side switching device toward the high-side switching device side longer than a second facing region facing the driver IC is provided,
in the third facing region, a conductive member electrically connecting a terminal in a front surface side of the high-side switching device and the output side plate lead portion is provided, and
a length of a first conductive member connecting an output terminal of the driver IC and a terminal of the low-side switching device is shorter than a length of a second conductive member connected the output terminal of the driver IC and a terminal of the high-side switching device.

2. The semiconductor device according to claim 1, wherein the high-side switching device is a high-side vertical switching device, and
the low-side switching device is a low-side vertical switching device having a channel of the same conductive type as the high-side vertical switching device.

3. The semiconductor device according to claim 1, wherein the high-side switching device and the driver IC are both arranged so as to have side surfaces facing the low-side switching device.

4. The semiconductor device according to claim 1, wherein the ground side plate lead portion has a region corresponding to a first side of the package and a second side thereof adjacent to the first side, and
the first and second sides are electrically connected with a front surface terminal of the low-side switching device by a conductive member.

5. The semiconductor device according to claim 4, wherein the conductive member electrically connecting the first and second sides with a front surface terminal of the low-side switching device is a wire.

6. The semiconductor device according to claim 4, wherein the conductive member electrically connecting the first and second sides with a front surface terminal of the low-side switching device is a metal plate.

7. A semiconductor device comprising:
a high-side switching device;
a low-side switching device;
a driver IC controlling to turn on and off the high-side switching device and the low-side switching device;
an input side plate lead portion, to which an input side voltage is electrically applied, which is electrically connected to an electrode in a back surface side of a high-side switching device, and which mounts the high-side switching device thereon;
an output side plate lead portion, to which an output side voltage is electrically applied, which is electrically connected to an electrode in a back surface side of the low-side switching device, and which mounts the low-side switching device thereon;

a driver side plate lead portion, which mounts the driver IC thereon; and a ground side plate lead portion, to which a ground side voltage is electrically applied, and the high-side switching device, the low-side switching device, the driver IC, the input side plate lead portion, the output side plate lead portion, the driver side plate lead portion, and the ground side plate lead portion being stored in one package, wherein the shortest distance between the driver IC and the low-side switching device is smaller than the shortest distance between the driver IC and the high-side switching device.

8. The semiconductor device according to claim 7, wherein the high-side switching device and the driver IC are both arranged so as to have side surfaces facing the low-side switching device.

9. The semiconductor device according to claim 7, wherein a gate terminal of the low-side switching device is provided in a first line side facing one side of a plane of the driver IC among sides of a plane of the low-side switching device, in the output side plate lead portion, a third facing region where a first facing region facing the high-side switching device toward the high-side switching device side longer than a second facing region facing the driver IC is provided, in the third facing region, a conductive member electrically connecting a terminal in a front surface side of the high-side switching device and the output side plate lead portion is provided, and a length of a first conductive member connecting an output terminal of the driver IC and a terminal of the low-side switching device is shorter than a length of a second conductive member connecting the output terminal of the driver IC and a terminal of the high-side switching device.

10. The semiconductor device according to claim 9, wherein the conductive member electrically connecting a terminal in a front surface side of the high-side switching device and the output side plate lead portion is a wire.

11. The semiconductor device according to claim 9, wherein the conductive member electrically connecting a terminal in a front surface side of the high-side switching device and the output side plate lead portion is a metal plate.

* * * * *